(12) United States Patent
Onozawa et al.

(10) Patent No.: US 10,205,012 B2
(45) Date of Patent: Feb. 12, 2019

(54) SEMICONDUCTOR DEVICE

(71) Applicant: FUJI ELECTRIC CO., LTD., Kanagawa (JP)

(72) Inventors: Yuichi Onozawa, Matsumoto (JP); Kota Ohi, Matsumoto (JP); Tatsuya Naito, Matsumoto (JP); Misaki Takahashi, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/453,916

(22) Filed: Mar. 9, 2017

(65) Prior Publication Data

US 2017/0263740 A1    Sep. 14, 2017

(30) Foreign Application Priority Data

Mar. 11, 2016 (JP) ................. 2016-048594
Feb. 23, 2017 (JP) ................. 2017-032728

(51) Int. Cl.
*H01L 29/739* (2006.01)
*H01L 23/528* (2006.01)
(Continued)

(52) U.S. Cl.
CPC ........ *H01L 29/7397* (2013.01); *H01L 23/528* (2013.01); *H01L 23/53257* (2013.01); *H01L 27/0716* (2013.01); *H01L 29/063* (2013.01); *H01L 29/0615* (2013.01); *H01L 29/0696* (2013.01); *H01L 29/1095* (2013.01); *H01L 29/407* (2013.01); *H01L 29/4236* (2013.01); *H01L 29/4238* (2013.01); *H01L 29/8613* (2013.01); *H01L 27/0727* (2013.01); *H01L 29/0692* (2013.01)

(58) Field of Classification Search
CPC ............ H01L 23/528; H01L 23/53257; H01L 29/7397; H01L 29/063; H01L 29/0696; H01L 29/407

See application file for complete search history.

(56) References Cited

U.S. PATENT DOCUMENTS

2008/0315301 A1* 12/2008 Takemori ............ H01L 29/1095
                                                            257/331
2013/0082301 A1    4/2013 Onozawa et al.
(Continued)

FOREIGN PATENT DOCUMENTS

JP    2011-187593 A    9/2011

*Primary Examiner* — Caridad Everhart

(57) ABSTRACT

Provided is a semiconductor device comprising: a semiconductor substrate; a plurality of first trench portions formed at a front surface side of the semiconductor substrate and extending in a predetermined extending direction in a planar view; an emitter region of a first conductivity type formed between adjacent trenches of the plurality of first trench portions at the front surface side of the semiconductor substrate; a first contact region of a second conductivity type formed between the adjacent trenches of the plurality of first trench portions, the first contact region and the emitter region being arranged alternately in the extending direction; and a second contact region of a second conductivity type formed above the first contact region to be apart from the emitter region and having a higher doping concentration than the first contact region.

22 Claims, 15 Drawing Sheets

(51) Int. Cl.
  *H01L 23/532*  (2006.01)
  *H01L 27/07*  (2006.01)
  *H01L 29/06*  (2006.01)
  *H01L 29/40*  (2006.01)
  *H01L 29/423*  (2006.01)
  *H01L 29/10*  (2006.01)
  *H01L 29/861*  (2006.01)

(56)  References Cited

U.S. PATENT DOCUMENTS

2013/0082302 A1* 4/2013 Nakamura ........ H01L 29/41741
  257/155
2015/0295071 A1* 10/2015 Hikasa ................ H01L 29/0619
  257/144
2017/0352747 A1* 12/2017 Sumitomo ............ H01L 29/739

* cited by examiner

SEMICONDUCTOR DEVICE

The contents of the following Japanese patent application(s) are incorporated herein by reference:
NO. 2016-048594 filed in JP on Mar. 11, 2016, and
NO. 2017-032728 filed in JP on Feb. 23, 2017

BACKGROUND

1. Technical Field

The present invention relates to a semiconductor device.

2. Related Art

Conventionally, a semiconductor device comprising a trench portion has been known in which a P+ layer for contact is formed to be a striped shape parallel to the trench portion (for example, see Patent Document 1).

Patent Document 1: Japanese Patent Application Publication No. 2011-187593

However, as a downscale of the conventional semiconductor device is progressed to narrow a trench interval, the P+ layer may contact the trench portion to increase a gate threshold voltage unexpectedly.

SUMMARY

In a first aspect of the present invention, provided is a semiconductor device comprising: a semiconductor substrate; a plurality of first trench portions formed at a front surface side of the semiconductor substrate and extending in a predetermined extending direction in a planar view; an emitter region of a first conductivity type formed between adjacent trenches of the plurality of first trench portions at the front surface side of the semiconductor substrate; a first contact region of a second conductivity type formed between the adjacent trenches of the plurality of first trench portions, the first contact region and the emitter region being arranged alternately in the extending direction; and a second contact region of a second conductivity type formed above the first contact region to be apart from the emitter region and having a higher doping concentration than the first contact region.

An interval in a planar view between the second contact region and the emitter region formed to be apart from each other may be larger than a difference between a depth of a lower end of the first contact region and a depth of a lower end of the emitter region.

The first contact region may be formed in at least some regions below the emitter region.

The emitter region and the first contact region may contact the plurality of first trench portions formed at both ends of the emitter region and the first contact region.

A shortest distance between the second contact region and a contact point of the plurality of first trench portions and the emitter region may be larger than a distance for which the emitter region and the first contact region overlap in the extending direction in a planar view.

A shortest distance between the second contact region and a contact point of the plurality of first trench portions and the emitter region may be larger than a difference between a depth of a lower end of the first contact region and a depth of a lower end of the emitter region.

The second contact region may be formed at a depth smaller than the emitter region.

The second contact region may contact the plurality of first trench portions formed at both ends of the second contact region.

The semiconductor device may further comprise an interlayer insulating film formed on the front surface of the semiconductor substrate; and an emitter electrode formed above the interlayer insulating film. The plurality of first trench portions may be arranged in a predetermined arrangement direction in a planar view. A contact hole is formed in the interlayer insulating film to connect the emitter electrode and the second contact region, and the second contact region may have a width in the arrangement direction larger than a width of the contact hole in the arrangement direction.

The emitter electrode and the second contact region may be electrically connected via a tungsten plug.

The semiconductor device may comprise: a transistor portion including the plurality of first trench portions, the emitter region, the first contact region and the second contact region; and a diode portion including a plurality of second trench portions which are formed at the front surface side of the semiconductor substrate and extend in a predetermined extending direction in a planar view, and a third contact region of a second conductivity type which is formed at the front surface side of the semiconductor substrate and has a higher doping concentration than the first contact region.

The third contact region may be provided in the extending direction in a discrete manner.

The third contact region may have an area, in a planar view, which is equal to or less than 50% of a contact area of an emitter electrode in the diode portion and the semiconductor substrate.

In a second aspect of the present invention, provided is a semiconductor device comprising a semiconductor substrate and a transistor portion and a diode portion formed in the semiconductor substrate, wherein the transistor portion includes: a plurality of first trench portions formed at a front surface side of the semiconductor substrate and extending in a predetermined extending direction in a planar view; an emitter region of a first conductivity type formed between adjacent trenches of the plurality of first trench portions at the front surface side of the semiconductor substrate; a first contact region of a second conductivity type formed between the adjacent trenches of the plurality of first trench portions, the first contact region and the emitter region being arranged alternately in the extending direction; and a second contact region of a second conductivity type formed above the first contact region and having a higher doping concentration than the first contact region. The diode portion may include: a plurality of second trench portions formed at a front surface side of the semiconductor substrate and extending in a predetermined extending direction in a planar view; and a third contact region of a second conductivity type formed at the front surface side of the semiconductor substrate and having a higher doping concentration than the first contact region.

The third contact region provided in the diode portion may be provided in the extending direction in a discrete manner.

The third contact region may have an area, in a planar view, which is equal to or less than 50% of a contact area of an emitter electrode in the diode portion and the semiconductor substrate.

In a third aspect of the present invention, provided is a semiconductor device comprising: a semiconductor substrate; a plurality of first trench portions formed at a front surface side of the semiconductor substrate and extending in a predetermined extending direction in a planar view; an emitter region of a first conductivity type formed between adjacent trenches of the plurality of first trench portions at the front surface side of the semiconductor substrate; a first contact region of a second conductivity type formed between the adjacent trenches of the plurality of first trench portions, the first contact region and the emitter region being arranged alternately in the extending direction; and a second contact region of a second conductivity type formed above the first contact region to contact the emitter region and having a higher doping concentration than the first contact region. The first contact region may have a depth in a direction from the front surface side to a back surface side of semiconductor substrate larger than the emitter region. An end of the first contact region along an extending direction of the plurality of first trench portions may reach a bottom surface of the emitter region. A position at which the end of the first contact region in the extending direction contacts the bottom surface of the emitter region is projected on the front surface of the semiconductor substrate at a junction position, and the junction position may be apart from a position of an end of the second contact region in the extending direction. The junction position may be inside the emitter region.

The second contact region may cover a position above an end of the emitter region in the extending direction of the trench portion.

A distance between the second contact region and the junction position may be larger than a junction depth of the emitter region.

The summary clause does not necessarily describe all necessary features of the embodiments of the present invention. The present invention may also be a sub-combination of the features described above.

DESCRIPTION OF THE EMBODIMENTS

Hereinafter, the present invention will be described through embodiments of the invention. However, the embodiments described below are not to limit the claimed inventions. Also, all of combinations of features described in the embodiments are not necessarily essential for means for solving the problem of the invention.

Example 1

Figure 1:
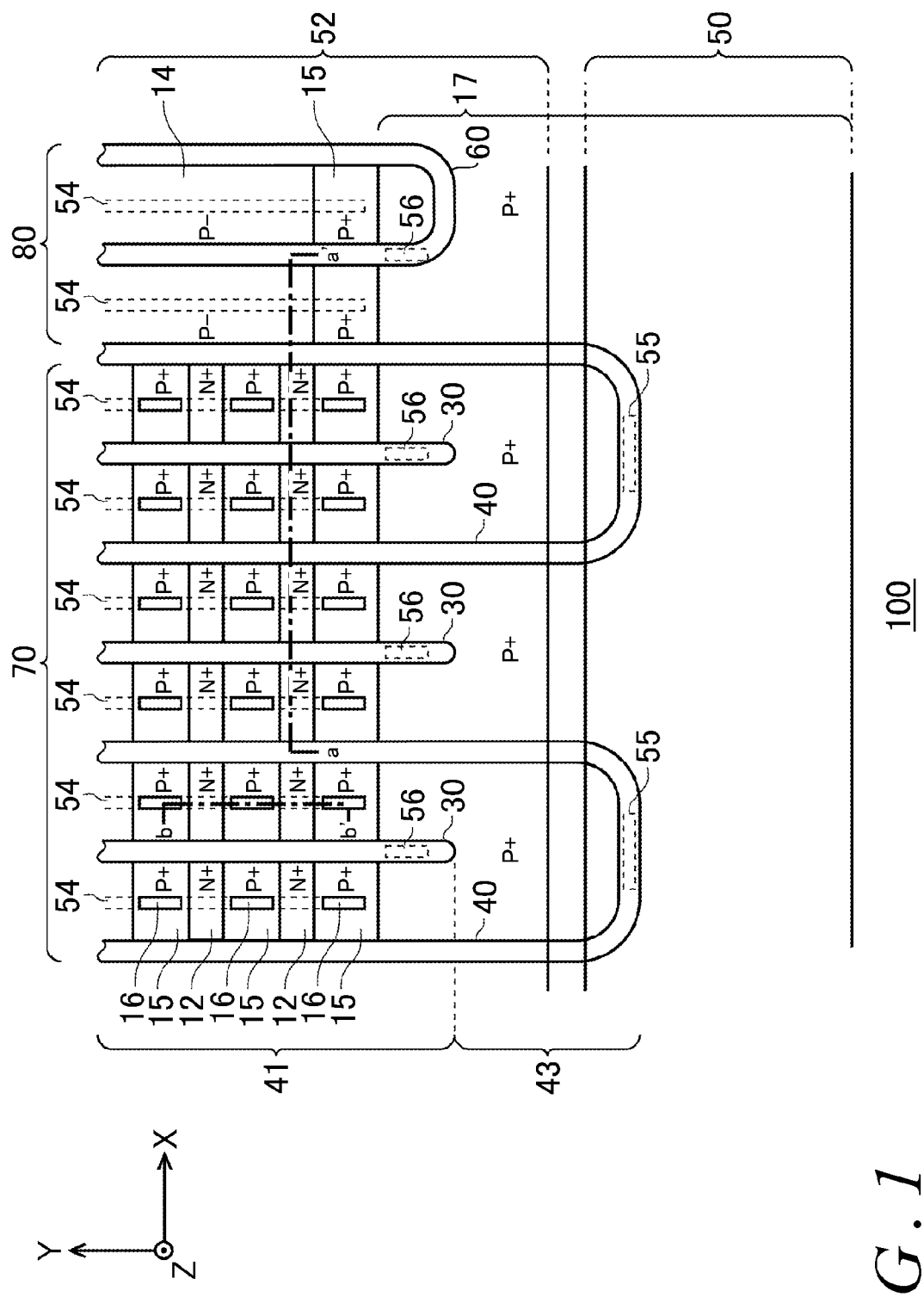
FIG. 1 is a plan view illustrating one example of a semiconductor device 100 according to Example 1.

FIG. 1 is a plan view illustrating one example of a semiconductor device 100 according to Example 1. The semiconductor device 100 of the present example is a semiconductor chip comprising a transistor portion 70 including a transistor such as an IGBT (Insulated Gate Bipolar Transistor). Also, the semiconductor device 100 may include a diode portion 80 including a diode such as an FWD (Free Wheel Diode). FIG. 1 illustrates a front surface of the chip around an end portion of the chip, while other regions are omitted.

As used herein, the X direction and the Y direction are directions vertical to each other, and the Z direction is a direction vertical to the X-Y plane. The X direction, the Y direction and the Z direction form a so-called right-handed system. The semiconductor substrate of the present example has a front surface in the +Z direction and a back surface in the -Z direction. Note that "on" and "above" mean the +Z direction. On the other hand, "under" and "below" mean the -Z direction.

Also, in FIG. 1, an active region of the semiconductor substrate of the semiconductor device 100 is illustrated and the semiconductor device 100 may include an edge termination region surrounding the active region. The active region refers to a region in which a current flows when the semiconductor device 100 is controlled in an ON state. The edge termination region reduces an electric field concentration in the semiconductor substrate at the front surface side thereof. The edge termination region has, for example, a guard ring, a field plate, an RESURF (reduced surface field) and a structure of a combination thereof.

The semiconductor device 100 of the present example includes a gate trench portion 40, a dummy trench portion 30, an emitter trench portion 60, a well region 17, an emitter region 12, a base region 14, a first contact region 15 and a second contact region 16 inside the front surface side of the semiconductor substrate. The semiconductor device 100 includes an emitter electrode 52, a gate electrode 50 and contact holes 54, 55, 56 above the front surface of the semiconductor substrate. Although an interlayer insulating film is formed between the emitter electrode 52 and the gate electrode 50, and the front surface of the semiconductor substrate, it is omitted in FIG. 1.

The contact holes 54, 55, 56 are formed to penetrate the interlayer insulating film formed above the semiconductor substrate. The positions at which the contact holes 54, 55, 56 are formed are particularly not limited to those of the present example.

The emitter electrode 52 is formed above the gate trench portion 40, the dummy trench portion 30, the emitter trench portion 60, the well region 17, the emitter region 12, the base region 14, the first contact region 15 and the second contact region 16. The emitter electrode 52 contacts the semiconductor substrate through the contact hole 54. The emitter electrode 52 contacts a dummy conductive portion 34 formed inside the dummy trench portion 30 through the contact hole 56, as will be described below. The emitter electrode 52 contacts an emitter conductive portion 64 formed inside the emitter trench portion 60 through the contact hole 56, as will be described below. The emitter electrode 52 is formed of metal-containing material. In one example, at least some regions of the emitter electrode 52 are formed of aluminum or aluminum alloy. Further, the emitter electrode 52 may also include a region formed of tungsten-containing material.

The gate electrode 50 contacts a gate conductive portion 44 formed inside the gate trench portion 40 through the contact hole 55, as will be described below. However, the gate electrode 50 is not formed above the dummy trench portion 30 or the emitter trench portion 60. The gate electrode 50 is formed of metal-containing material. In one example, at least some regions of the gate electrode 50 are formed of aluminum or aluminum alloy. Further, the gate electrode 50 may include a region formed of tungsten-containing material at a position which contacts the gate conductive portion 44. The gate electrode 50 of the present example is formed of the same material as that of the emitter electrode 52. However, the gate electrode 50 may also be formed of material different from that of the emitter electrode 52.

The dummy trench portion 30 is formed to extend in a predetermined extending direction on the front surface of the semiconductor substrate. One or more dummy trench portions 30 are arranged in a region of the transistor portion 70 along a predetermined arrangement direction at a predetermined interval relative to the gate trench portions 40. The dummy trench portion 30 of the present example has a linear shape and is formed to extend in a direction vertical to the arrangement direction. As used herein, the arrangement direction of the trench portion refers to the X axis direction and a transverse direction of the trench while the extending direction of the trench portion refers to the Y axis direction and a longitudinal direction of the trench.

The contact hole 56 is formed in an interlayer insulating film which covers the dummy trench portion 30. The contact hole 56 of the present example is formed at an end portion of the dummy trench portion 30. The position of the contact hole 56 is not limited as in the present example as long as it is provided to correspond to the dummy trench portion 30.

The gate trench portion 40 is formed to extend in a predetermined extending direction on the front surface of the semiconductor substrate. The gate trench portions 40 of the present example are arranged alternately relative to the dummy trench portions 30 in the predetermined arrangement direction. Also, the gate trench portion 40 of the present example is arranged at a constant interval relative to the dummy trench portion 30. However, the arrangement of the dummy trench portion 30 and the gate trench portion 40 is not limited to the present example. In one example, the gate trench portion 40 may also be formed serially between two dummy trench portions 30.

Also, the gate trench portion 40 includes an opposing portion 41 and a protruding portion 43. The opposing portion 41 is formed to extend in the extending direction described above in an area opposite to the dummy trench portion 30. That is, the opposing portion 41 is formed to be parallel to the dummy trench portion 30. The protruding portion 43 further extends from the opposing portion 41 and is formed in an area not opposite to the dummy trench portion 30. In the present example, two opposing portions 41 provided at both sides of the dummy trench portion 30 are connected by one protruding portion 43. At least a portion of the protruding portion 43 may have a curved shape. Note that the dummy trench portion 30 and the gate trench portion 40 are one example of a first trench portion.

The contact hole 55 is formed in an interlayer insulating film which covers the protruding portion 43. The contact hole 55 may be formed in the protruding portion 43 to correspond to a region most distant from the opposing portion 41. The protruding portion 43 of the present example includes a portion extending in a direction orthogonal to the opposing portion 41 in the region most distant from the opposing portion 41. The contact hole 55 may be formed to correspond to the portion of the protruding portion 43.

The emitter trench portion 60 is provided in a region of the diode portion 80. The emitter trench portion 60 is formed on the front surface side of the semiconductor substrate 10 and extends in a predetermined extending direction in a planar view. The emitter trench portion 60 may have a shape similar to that of the gate trench portion 40. However, of the emitter trench portion 60 may have a length in the extending direction shorter than the gate trench portion 40. The emitter trench portion 60 of the present example has the same length as that of the dummy trench portion 30. Note that the emitter trench portion 60 is one example of a second trench portion.

The well region 17 is formed to cover a predetermined area from an end portion of the semiconductor substrate at the side at which the gate electrode 50 is provided. At least some regions of the dummy trench portion 30, the gate trench portion 40 and the emitter trench portion 60 at the gate electrode 50 side are formed in the well region 17. In the gate trench portion 40, at least some regions of the opposing portion 41 may be formed in the well region 17 while the entire protruding portion 43 may be formed in the well region 17. The semiconductor substrate has a first conductivity type while the well region 17 has a second conductivity type which is different from the semiconductor substrate. In the present example, the semiconductor substrate is of N− type while the well region 17 is of P+ type. In the present example, the first conductivity type is described as N type while the second conductivity type as P type. However, the first conductivity type may be P type while the second conductivity type may be N type.

The base region 14 is formed in a region positioned between the trench portions. The base region 14 is of the second conductivity type and has a lower doping concentration than the well region 17. The base region 14 of the present example is of P− type.

The first contact region 15 is region of the second conductivity type and has a higher doping concentration than the base region 14 in the front surface of the base region 14. The first contact region 15 of the present example is of P+ type. Note that the diode portion 80 may not include the first contact region 15 formed therein.

The emitter region 12 is selectively formed in the transistor portion 70 at a portion of the front surface of the semiconductor substrate as a region having a higher doping concentration than the semiconductor substrate and of the first conductivity type. The emitter region 12 of the present example is of N+ type.

The first contact region 15 and the emitter region 12 are formed from one of the adjacent trench portions to the other, respectively. That is, the first contact region 15 and the emitter region 12 contact a plurality of trench portions formed at both ends of the first contact region 15 and the emitter region 12 in the arrangement direction of the trench portion. One or more first contact regions 15 and one or more emitter regions 12 of the transistor portion 70 are formed in a region positioned between trench portions to be exposed alternately along the extending direction of the trench portions.

The second contact region 16 is a region having a higher doping concentration than the first contact region 15 and of the second conductivity type. The second contact region 16 of the present example is of P++ type. The second contact region 16 is formed above the first contact region 15. The second contact region 16 of the present example has a rectangular shape. However, the second contact region 16 may also have a shape with rounded corners. Note that the second contact region 16 may be formed to reduce a contact resistance on an interface with the emitter electrode 52.

The second contact region 16 is formed to be apart from the emitter region 12. Here, a gate threshold voltage Vth of the semiconductor device 100 is determined depending on a peak of the doping concentration in a mesa portion adjacent to the gate trench portion 40. Therefore, if the second contact region 16 contacts the emitter region 12, the peak concentration in the vicinity of the gate trench portion 40 may be reduced. That is, the second contact region 16 is formed to be apart from the emitter region 12, thereby inhibiting decrease in the peak concentration of the base region 14 which determines the gate threshold voltage Vth. Also, the second contact region 16 is formed to be apart from the emitter region 12, thereby reducing a fluctuation in the gate threshold voltage Vth even if the position of the second contact region 16 is misaligned.

The contact hole 54 is formed in at least a portion above the second contact region 16 and the emitter region 12 in the transistor portion 70. Also, the contact hole 54 may also be formed above the first contact region 15. The contact hole 54 of the present example is formed across the emitter region 12, the first contact region 15 and the second contact region 16. However, in the transistor portion 70, the contact hole 54 is not formed in a region corresponding to the base region 14 and the well region 17.

Also, a width of the arrangement direction of the contact hole 54 of the present example is equal to a width of the arrangement direction of the second contact region 16. That is, the second contact region 16 is formed using the contact hole 54 as a mask. This reduces the number of steps of forming the second contact region 16, thereby reducing a manufacturing cost.

On the other hand, the contact hole 54 is formed above the base region 14 in the diode portion 80. In the present example, the contact hole 54 of the transistor portion 70 and the contact hole 54 of the diode portion 80 have the same length in the extending direction of each trench portion. However, the contact hole 54 of the transistor portion 70 and the contact hole 54 of the diode portion 80 may have a different length in the extending direction of each trench portion.

Figure 2:
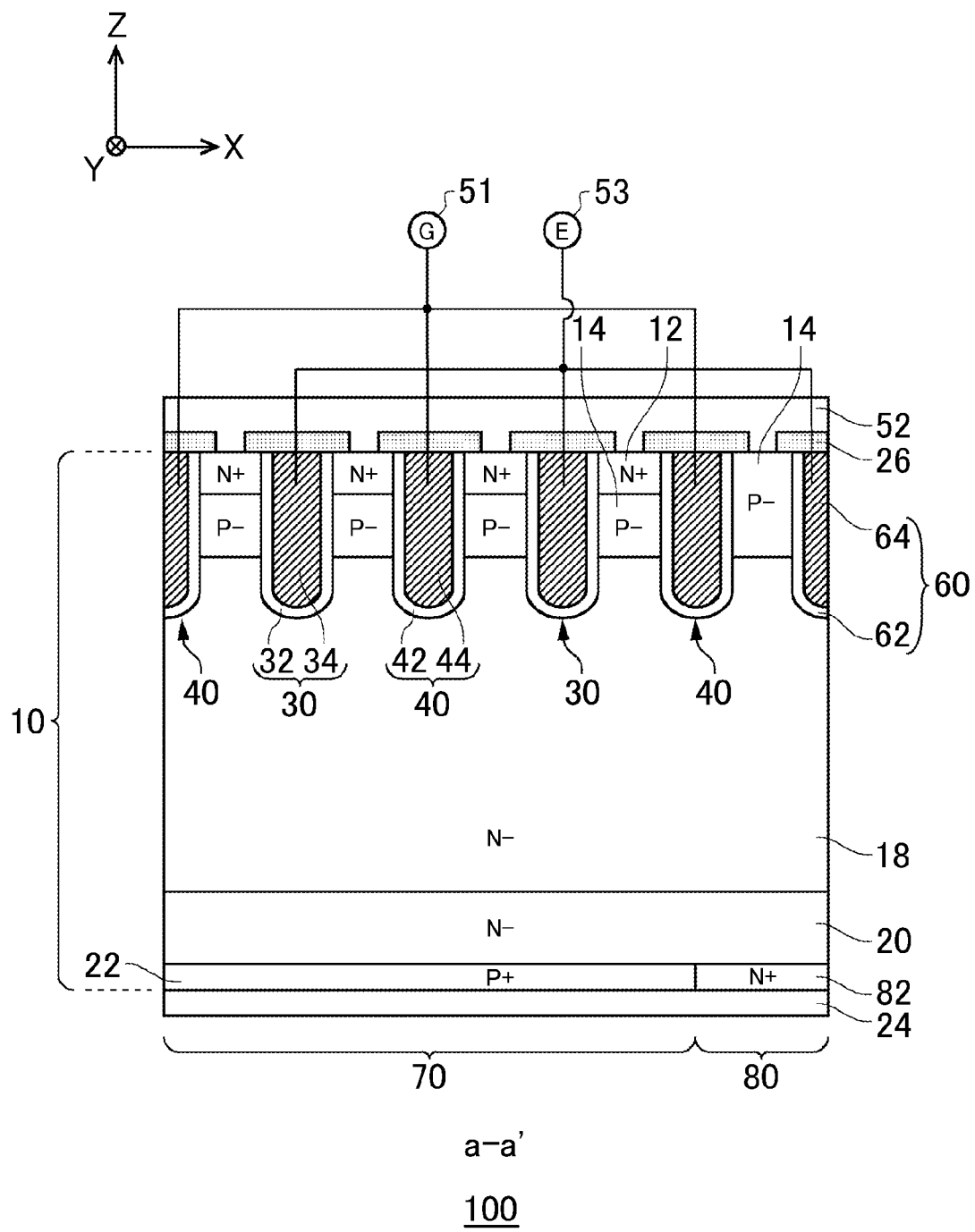
FIG. 2 is a diagram illustrating one example of an a-a' cross section of the semiconductor device 100 according to Example 1.

FIG. 2 is a diagram illustrating one example of an a-a' cross section of the semiconductor device 100 according to Example 1. The semiconductor device 100 of the present example comprises, in the cross section, a semiconductor substrate 10, an emitter electrode 52 and a collector electrode 24. The emitter electrode 52 is formed on the front surface of the semiconductor substrate 10. The emitter electrode 52 is electrically connected to an emitter terminal 53.

The collector electrode 24 is formed on the back surface of the semiconductor substrate 10. The collector electrode 24 is electrically connected to a collector terminal. The emitter electrode 52 and the collector electrode 24 are formed of conductive material such as metal. As used herein, for each component such as a substrate, layer and a region, a surface at the emitter electrode 52 side is referred to as a front surface and a surface at the collector electrode 24 side is referred to as a back surface or a bottom portion. Also, a direction connecting the emitter electrode 52 and the collector electrode 24 is referred to as a depth direction.

The semiconductor substrate 10 may be a silicon substrate, or may also be a compound semiconductor substrate, such as a silicon substrate, nitride semiconductor substrate, for example. The base region 14 of P– type is formed in the semiconductor substrate 10 at the front surface side thereof. Also, the emitter region 12 of N+ type is selectively formed in some regions at the front surface side of the base region 14. Also, the semiconductor substrate 10 further includes a drift region 18 of N– type, a buffer region 20 of N– type, a collector region 22 of P+ type, and a cathode region 82 of N+ type.

The drift region 18 is formed at the back surface side of the base region 14. The buffer region 20 is formed at the back surface side of the drift region 18. A doping concentration of the buffer region 20 is higher than a doping concentration of the drift region 18. The buffer region 20 may work as a field stop layer to prevent a depletion layer expanding from the back surface side of the base region 14 from reaching the collector region 22 and the cathode region 82.

The collector region 22 is formed at the back surface side of the buffer region 20 in a region of the transistor portion 70. The cathode region 82 is formed at the back surface side of the buffer region 20 in a region of the diode portion 80. Also, the back surface of the collector region 22 and the cathode region 82 is provided with the collector electrode 24.

One or more gate trench portions 40, one or more dummy trench portions 30, and one or more emitter trench portions 60 are formed at the front surface side of the semiconductor substrate 10. Each trench portion extends from the front surface of the semiconductor substrate 10, penetrates the base region 14 and reaches the drift region 18. In the present example, the gate trench portion 40 and the dummy trench portion 30 extend from the front surface of the semiconductor substrate 10, penetrate the emitter region 12 and the base region 14 and reach the drift region 18. Also, the emitter trench portion 60 extends from the front surface of the semiconductor substrate 10, penetrates the base region 14 and reaches the drift region 18.

The gate trench portion 40 includes an insulating film 42 and a gate conductive portion 44 formed at the front surface side of the semiconductor substrate 10. The gate trench portion 40 is formed in a trench formed by etching the semiconductor substrate 10.

The gate conductive portion 44 is formed at the front surface side of the semiconductor substrate 10 in the gate trench portion 40. The gate conductive portion 44 at least includes a region opposite to adjacent base region 14. Each gate conductive portion 44 is electrically connected to the gate terminal 51. In the present example, in the protruding portion 43 as illustrated in FIG. 1, the gate conductive portion 44 is electrically connected to the gate electrode 50. Also, the gate electrode 50 is electrically connected to the gate terminal 51. If a predetermined voltage is applied to the gate conductive portion 44 via the gate terminal 51, a channel is formed on an outer layer of the interface of the base region 14 which contacts the gate trench. The gate conductive portion 44 of the present example is formed of conductive material such as polysilicon. The gate conductive portion 44 is one example of a first conductive portion in the gate trench portion 40.

The insulating film 42 is formed to cover the gate conductive portion 44. That is, the insulating film 42 insulates the gate conductive portion 44 from the semiconductor substrate 10. The insulating film 42 may be formed by oxidizing or nitriding a semiconductor of an inner wall of the gate trench.

The dummy trench portion 30 includes an insulating film 32 and a dummy conductive portion 34 formed at the front surface side of the semiconductor substrate 10. The dummy trench portion 30 is formed in a trench formed by etching the semiconductor substrate 10.

The dummy conductive portion 34 is formed at the front surface side of the semiconductor substrate 10 in the dummy trench portion 30. The dummy conductive portion 34 may be formed of the same material as that of the gate conductive portion 44. For example, the dummy conductive portion 34 is formed of conductive material such as polysilicon. The dummy conductive portion 34 may have the same length as that of the gate conductive portion 44 in a depth direction. The dummy conductive portion 34 is one example of the first conductive portion of the dummy trench portion 30.

The insulating film 32 is formed to cover a side surface and a bottom surface of the dummy conductive portion 34. That is, the insulating film 32 insulates the dummy conductive portion 34 from the semiconductor substrate 10. The insulating film 32 may be formed by oxidizing or nitriding a semiconductor of an inner wall of the dummy trench.

The diode portion 80 is provided in a region in the vicinity of the transistor portion 70. The diode portion 80 includes the base region 14, the drift region 18 and the buffer region 20 in the same layer as those of the transistor portion 70. The buffer region 20 of the diode portion 80 is provided with the cathode region 82 at the back surface side thereof. Also, the diode portion 80 includes one or more emitter trench portions 60. Also, the diode portion 80 does not include the emitter region 12 formed therein.

The emitter trench portion 60 is formed to extend from the front surface side of the base region 14, penetrate the base region 14 and reach the drift region 18. Each emitter trench portion 60 includes an insulating film 62 and an emitter conductive portion 64.

The emitter conductive portion 64 is formed at the front surface side of the semiconductor substrate 10 in the emitter trench portion 60. The emitter conductive portion 64 is electrically connected to the emitter terminal 53.

The insulating film 62 is formed to cover a side surface and a bottom surface of the emitter conductive portion 64. Also, the insulating film 62 is formed to cover an inner wall of the emitter trench.

Note that the diode portion 80 is defined as a region on the back surface which matches the cathode region 82, or a projection region in which the cathode region 82 is perpendicularly projected on the back surface of the semiconductor substrate 10 with respect to the front surface side, in the active region. Also, the transistor portion 70 is defined as a projection region in which the collector region 22 is perpendicularly projected on the back surface of the semiconductor substrate 10 with respect to the front surface side, and a region in which predetermined unit configurations each including the emitter region 12 and the first contact region 15 are arranged in a regular manner, in the active region.

Figure 3:
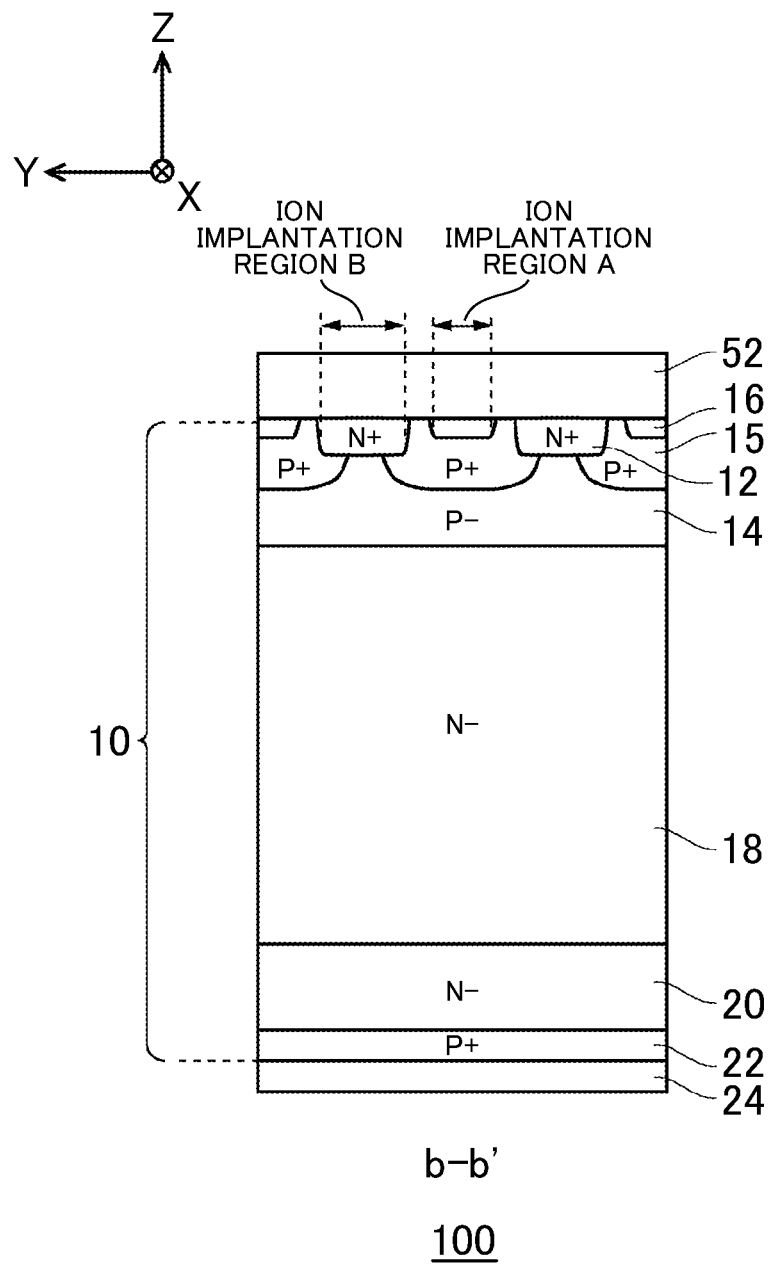
FIG. 3 is a diagram illustrating one example of a b-b' cross section of the semiconductor device 100 according to Example 1.

FIG. 3 is a diagram illustrating one example of a b-b' cross section of the semiconductor device 100 according to Example 1. The semiconductor device 100 of the present example comprises, in the cross section, a semiconductor substrate 10, an emitter electrode 52 and a collector electrode 24.

The base region 14 is formed at a uniform depth in the b-b' cross section on the front surface of the semiconductor substrate 10. The base region 14 of the present example is formed the entire region surrounded by the dummy trench portion 30 and the gate trench portion 40 in a uniform manner.

The first contact region 15 is formed above the base region 14. The first contact regions 15 are formed to be arranged alternately relative to the emitter regions 12. However, the first contact region 15 may include a region which overlaps the emitter region 12 in a planar view. That is, the first contact region 15 of the present example is formed in at least some regions below the emitter region 12. Specifically, an end of the first contact region 15 at the Y axis direction side along the trench may be formed to cover an end of the emitter region 12 at the Y axis direction side along the trench from below. This inhibits an increase in a voltage drop below the emitter region 12 when minority carriers flow from below the emitter region 12 to the first contact region 15, thereby preventing a latch up. A minority carrier is a hole in the present example. Note that, as used herein, a planar view refers to a view point when viewed from the front surface side to the back surface side of the semiconductor substrate 10.

The second contact region 16 is formed above the base region 14 at a depth smaller than the emitter region 12. For example, the description that the second contact region 16 is formed at a depth smaller than the emitter region 12 means that the second contact region 16 is formed at a small depth such that the lowest end of the second contact region 16 is positioned closer to the front surface side of the semiconductor substrate 10 than the lowest end of the emitter region 12. Also, the description that the second contact region 16 is formed at a depth smaller than the emitter region 12 may also mean that the second contact region 16 is formed such that the doping concentration peak of the second contact region 16 is positioned at a depth smaller than the doping concentration peak of the emitter region 12.

The second contact region 16 of the semiconductor device 100 according to Example 1 is manufactured as described below, as one example. After forming the trench portions, the base region 14 is formed in the mesa portion positioned between the trench portions. The base region 14 is formed by ion implantation with a P type dopant and thermal diffusion at approximately 1100 degrees C. to 1200 degrees C. Subsequently, the first contact region 15 is formed. The first contact region 15 may be formed by using a resist mask for selective ion implantation with a P type dopant (for example, boron) and thermal annealing at approximately 1000 degrees C. An ion implantation region A of a P type dopant is as shown, for example. Subsequently, the emitter region 12 is formed. The emitter region 12 may be formed by using a resist mask for selective ion implantation with an N type dopant (for example, arsenic) and thermal annealing at approximately 1000 degrees C. An ion implantation region B of an N type dopant is as shown, for example. The ion implantation region B of an N type dopant may be separated from the ion implantation region A of a P type dopant along the extending direction of the trench portion. Note that the sequential order of forming the first contact region 15 and forming the emitter region 12 may be reversed.

Subsequently, the interlayer insulating film is patterned after being deposited, and the contact hole 54 is formed. Subsequently, the second contact region 16 is formed. The second contact region 16 may be formed by using a resist mask for selective ion implantation with a P type dopant (for example, boron, boron fluoride $BF_2$ and the like) and thermal annealing at approximately 900 degrees C. Annealing may also be flash lamp annealing. A temperature of thermal annealing at which the second contact region 16 is formed is lower than a temperature of thermal annealing at which the first contact region 15 is formed. Manufacturing steps other than those described above may be general and well known manufacturing steps.

The first contact region 15 and the second contact region 16 may be formed by using a resist mask patterned with the same photo mask. The temperature at which the second contact region 16 is formed is lowered. Therefore, even if the same photo mask is used, in the shapes of the first contact region 15 and the second contact region 16 in a finished state after manufacturing processes of the semiconductor device 100 (hereinafter, simply referred to as being in a finished state), the second contact region 16 has shorter diffusion depth (junction depth) and length of lateral diffusion (diffusion parallel to the X-Y plane in FIG. 3) of the P type dopant.

As one example, if the emitter region 12 is formed by ion implantation with a dopant of arsenic, a diffusion distance by annealing at approximately 1000 degrees C. is smaller than a diffusion distance of boron of the first contact region 15. Further, if the second contact region 16 is formed by ion implantation with a dopant of boron fluoride and by flash lamp annealing, the second contact region 16 has a smaller diffusion depth than arsenic of the emitter region 12. That is, there is even less diffusion in a lateral direction in the second contact region 16 than in the emitter region 12. This allows the second contact region 16 to be formed inside the first contact region 15, without reaching the emitter region 12.

Alternatively, the first contact region 15 and the second contact region 16 may be formed by using resist masks patterned with different photo masks. In this case, a photo mask may be used which depicts the second contact region 16 inside the first contact region 15.

Comparative Example 1

Figure 4:
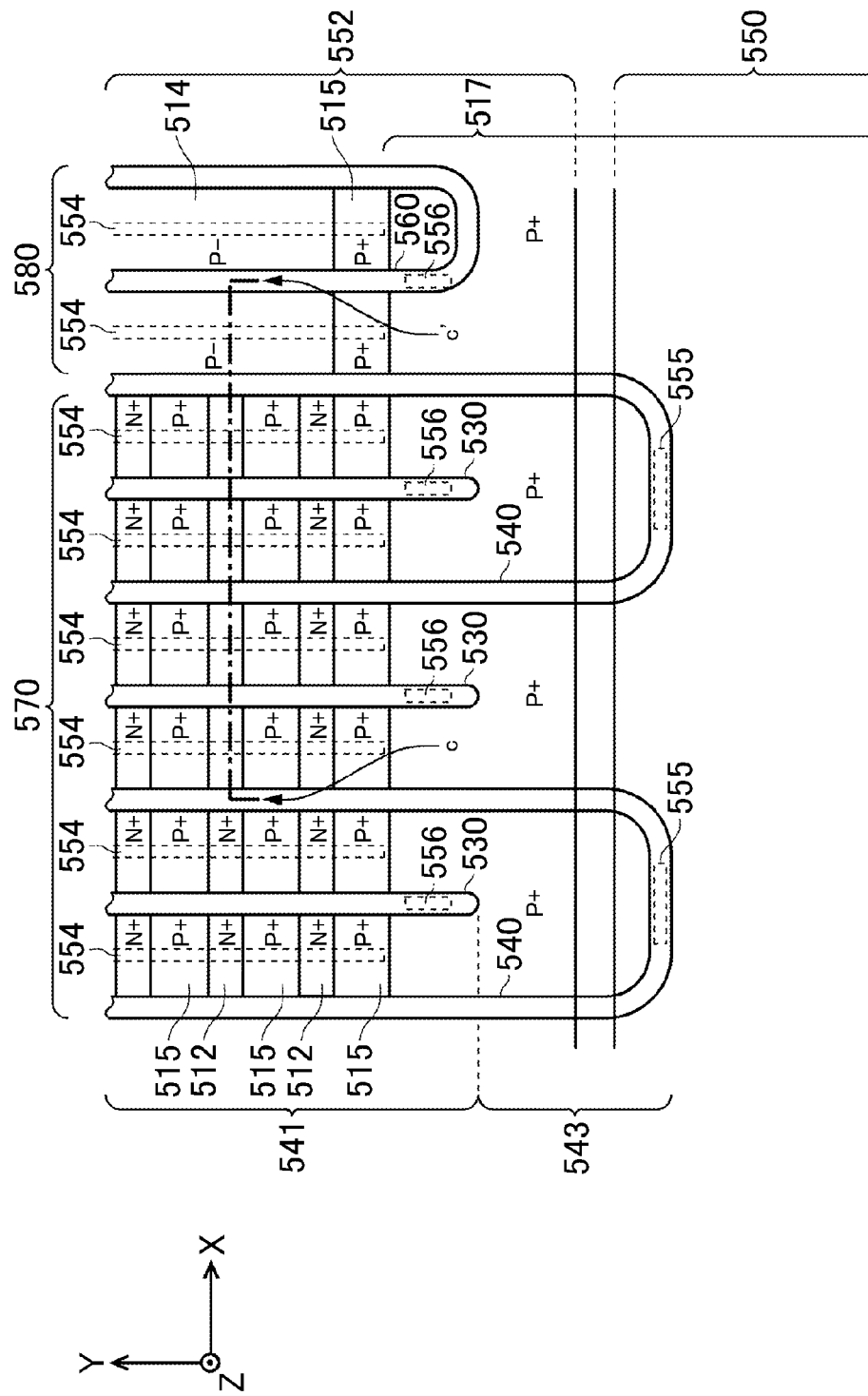
FIG. 4 is a plan view illustrating one example of a semiconductor device 500 according to Comparative Example 1.
Figure 5:
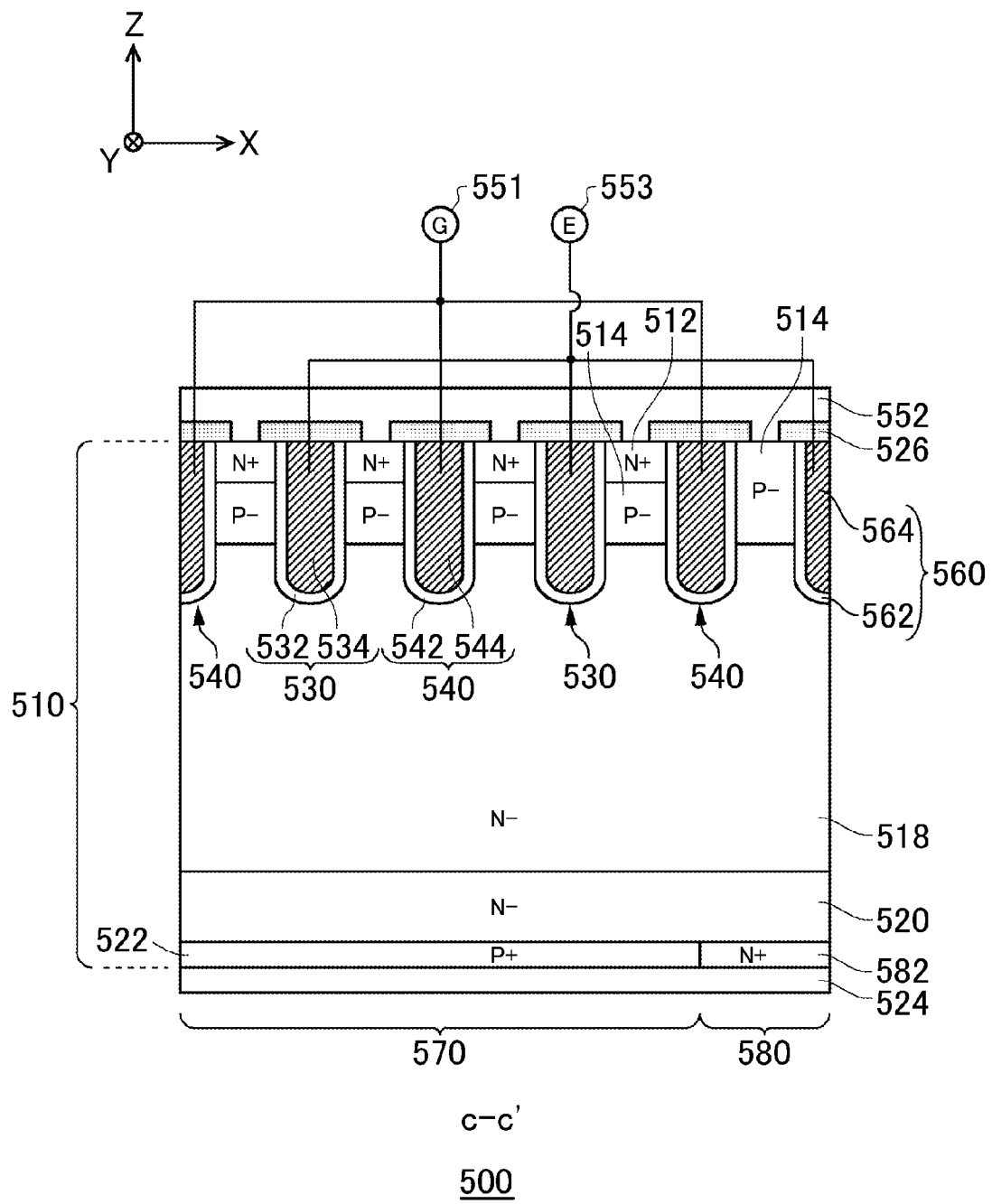
FIG. 5 illustrates one example of a c-c' cross section of the semiconductor device 500 according to Comparative Example 1.

FIG. 4 is a plan view illustrating one example of a semiconductor device 500 according to Comparative Example 1. FIG. 5 illustrates one example of a c-c' cross section of the semiconductor device 500 according to Comparative Example 1. The semiconductor device 500 of the present example includes a contact region 515 formed in an extending direction.

The semiconductor device 500 of the present example comprises a transistor portion 570 and a diode portion 580. The semiconductor device 500 comprises an emitter region 512, a base region 514, a contact region 515, a well region 517, an interlayer insulating film 526, a dummy trench portion 530, a gate trench portion 540, an emitter trench portion 560, a gate electrode 550 and an emitter electrode 552 on a front surface of the semiconductor substrate 510. The dummy trench portion 530 includes an insulating film 532 and a dummy conductive portion 534 while the gate trench portion 540 includes an insulating film 542 and a gate conductive portion 544. Also, the gate trench portion 540 includes an opposing portion 541 and a protruding portion 543. The emitter trench portion 560 includes an insulating film 562 and an emitter conductive portion 564.

Also, the semiconductor device 500 of the present example includes a drift region 518, a buffer region 520, a collector region 522 and a cathode region 582 formed in the semiconductor substrate 510. The semiconductor substrate 510 includes a collector electrode 524 formed at a back surface side thereof. Note that the gate electrode 550 is connected to a gate terminal 551 and connected to a gate conductive portion formed inside the gate trench portion 540 via a contact hole 555. Also, the emitter electrode 552 is connected to an emitter terminal 553. The emitter electrode 552 is connected to the semiconductor substrate 510 via a contact hole 554. The emitter electrode 552 is connected to a conductive portion formed inside the dummy trench portion 530 or the emitter trench portion 560 via a contact hole 556.

The contact region 515 is formed to extend in the extending direction of the trench portion. Also, the emitter regions 512 and the contact regions 515 are formed alternately in the extending direction of the trench portion. That is, the contact region 515 of the present example is formed to contact the emitter region 512. However, as a downscale is progressed to narrow a trench interval, P type dopants of the contact region 515 may be diffused at a peak concentration position of the base region 514 below the emitter region 512 to increase a doping concentration of the base region 514. As the doping concentration of the base region 514 is increased, the gate threshold voltage rises. Also, if the semiconductor device 500 of the present example includes a P++ type contact region having a further higher doping concentration formed therein, in addition to the structure in which the emitter regions 512 and the contact regions 515 are formed alternately, the gate threshold voltage Vth may be readily affected.

Example 2

Figure 6:
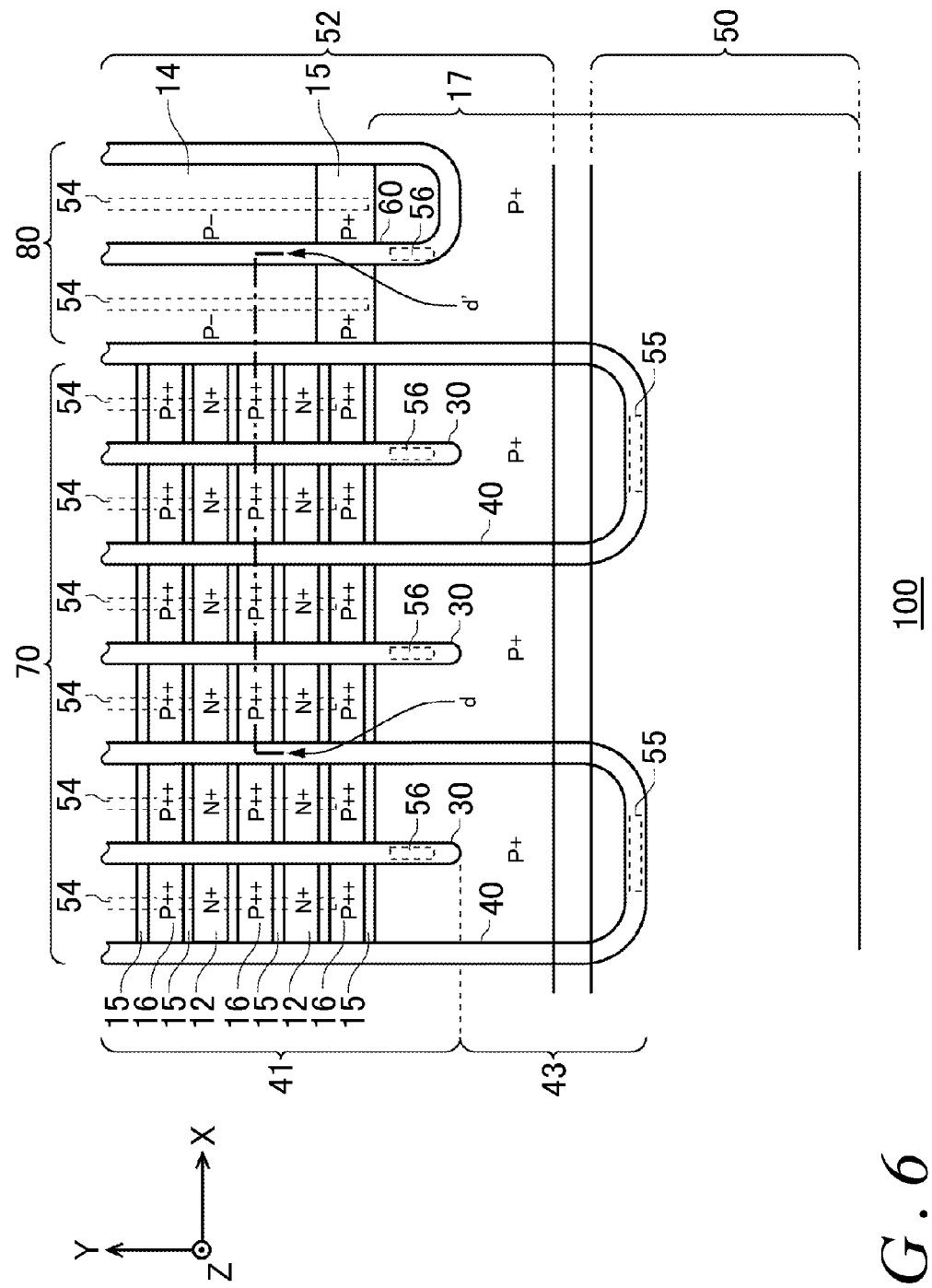
FIG. 6 is a plan view illustrating one example of the semiconductor device 100 according to Example 2.

FIG. 6 is a plan view illustrating one example of the semiconductor device 100 according to Example 2. The semiconductor device 100 of the present example includes a second contact region 16 which contacts the trench portion. Example 2 is different from Example 1 in that the second contact region 16 contacts a plurality of trench portions formed at both ends thereof.

The second contact region 16 is formed to contact the dummy trench portion 30 and the gate trench portion 40 formed at both ends of the second contact region 16. However, the second contact region 16 is formed to be apart from the emitter region 12. In this way, provided that the second contact region 16 is formed to be apart from the emitter region 12, a width of the second contact region 16 in the arrangement direction is not particularly limited. That is, the width of the arrangement direction of the second contact region 16 may be changed depending on characteristics of the semiconductor device 100 as appropriate. Note that the first contact region 15 may be formed in the diode portion 80, or may not be formed in the diode portion 80, similar to Example 1.

Figure 7:
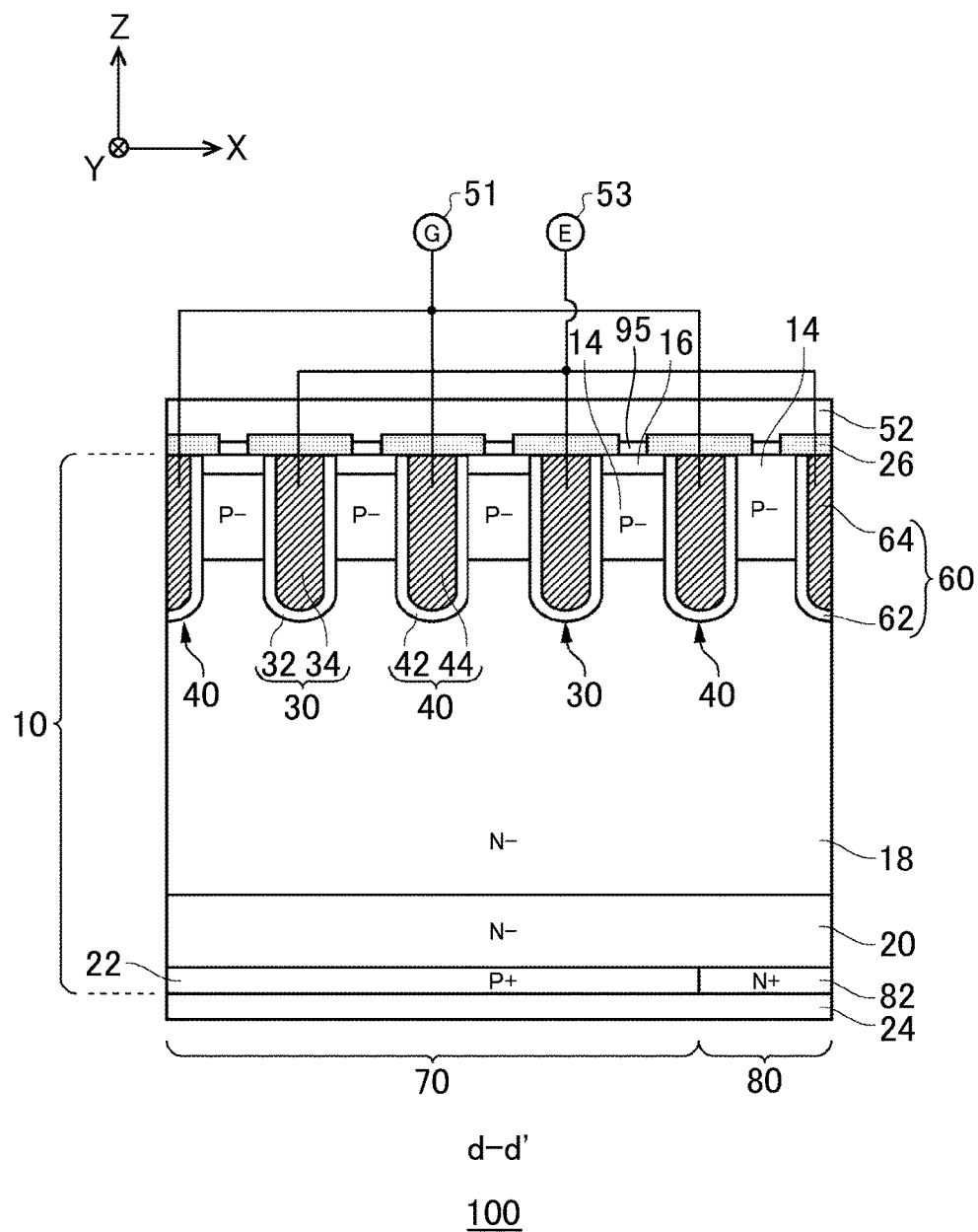
FIG. 7 illustrates one example of a d-d' cross section of the semiconductor device 100 according to Example 2.

FIG. 7 illustrates one example of a d-d' cross section of the semiconductor device 100 according to Example 2. The semiconductor device 100 of the present example comprises a tungsten plug 95.

The tungsten plug 95 electrically connects the emitter electrode 52 and the second contact region 16. In the semiconductor device 100 of the present example, the second contact region 16 is formed to contact the tungsten plug 95, thereby reducing a contact resistance of the interface of the tungsten plug 95. This results in the semiconductor device 100 of the present example inhibiting an increase in the contact resistance when the tungsten plug 95 is used.

Note that in Example 1, both of the transistor portion 70 and the diode portion 80 may include the tungsten plug 95 formed therein.

Figure 8:
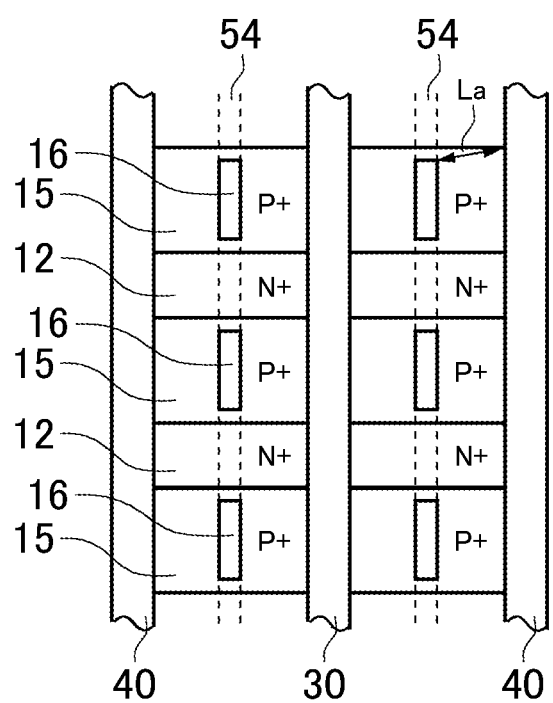
FIG. 8 illustrates one example of an enlarged plan view of the semiconductor device 100.

FIG. 8 illustrates one example of an enlarged plan view of the semiconductor device 100. In the present example, one example of a positional relationship between the second contact region 16 and the other regions is illustrated.

A distance La indicates the shortest distance between the second contact region 16 and a contact point of the gate trench portion 40 and the emitter region 12. Also, the distance La may indicate the shortest distance between the second contact region 16 and a contact point of the dummy trench portion 30 and the emitter region 12.

In the present example, the emitter regions 12 are separated in the extending direction of the gate trench portion 40 with the first contact region 15 positioned therebetween. Similarly, Vth determination regions 65 described below are separated in the extending direction of the gate trench portion 40 with the first contact region 15 positioned therebetween, in the base region 14 which contacts a side wall of the gate trench portion 40.

Figure 9:
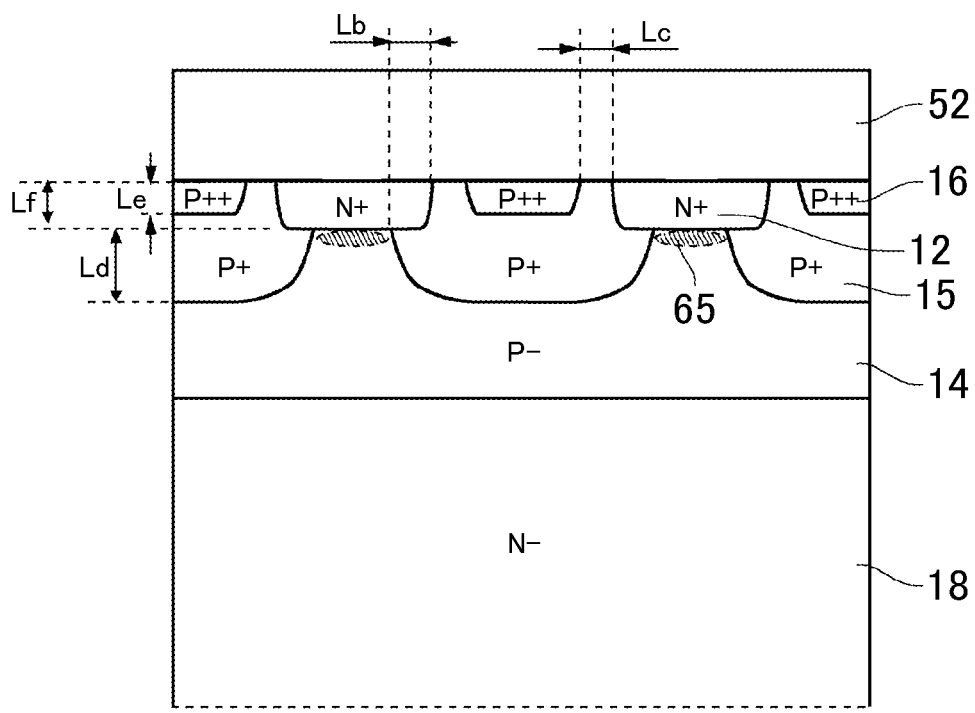
FIG. 9 illustrates one example of an enlarged b-b' cross section of the semiconductor device 100.

FIG. 9 illustrates one example of a b-b' cross section in FIG. 1 of the semiconductor device 100. A distance Lb indicates a distance for which the emitter region 12 and the first contact region 15 overlap in the extending direction in a planar view. Alternatively, the distance Lb may be referred as a distance for which an end of the first contact region 15 at the Y axis direction side along the trench covers an end of the emitter region 12 at the Y axis direction side along the trench from below in a planar view. Also, the distance Lb may be a distance from an end portion of the emitter region 12 at the −Y axis direction side to an end portion of the first contact region 15 at the +Y axis direction side.

Here, preferably, the distance La is larger than the distance Lb. This allows the second contact region 16 and the emitter region 12 to be apart from each other even if the position of the second contact region 16 is misaligned to some extent. Also, this can inhibit an increase in the peak concentration of the base region 14 which determines the gate threshold voltage Vth.

A determination region (as used herein, referred to as a Vth determination region 65) of the gate threshold voltage Vth is a region in which, among the base regions 14 which contact the gate trench portion 40, the base region 14 reaches the peak concentration just under the emitter region 12. The Vth determination region 65 illustrated in FIG. 9 is a region which schematically illustrates the determination region 65 on a side wall of the gate trench portion 40 when the b-b' cross section is projected on the side wall of the trench. In practice, the shape and position of the Vth determination region 65 are not limited to those illustrated in FIG. 9.

In a planar view, a location in the second contact region 16 which is closest to the Vth determination region 65 is four corners of the second contact region 16 in FIG. 8. From the four corners of the second contact region 16, dopants (for example, boron) of the second contact region 16 may reach the Vth determination region 65. In this case, the dopants of the second contact region 16 pass through, for example, the first contact region 15, and further through a portion of the emitter region 12 which overlaps the first contact region 15 in the depth direction in a planar view, and reach the Vth determination region 65. The maximum doping concentration of the first contact region 15 is higher than the peak concentration of the base region 14 of the Vth determination region 65 on the order of approximately double digits. Further, the maximum doping concentration of the second contact region 16 is higher than the maximum doping concentration of the first contact region 15 on the order of approximately single digits. This concentration ratio allows the peak concentration of the base region 14 in the Vth determination region 65 to easily increase, when the dopants of the second contact region 16 reach the Vth determination region 65, thereby increasing the gate threshold voltage Vth.

In the present example, providing the distance La to be larger than the distance Lb makes it difficult that the dopants of the second contact region 16 reach the Vth determination region 65. This inhibits an increase in the gate threshold voltage Vth.

A distance Lc indicates an interval between the second contact region 16 and the emitter region 12. For example, the distance Lc indicates a distance between an end portion of the emitter region 12 at the +Y axis direction side and an end portion of the second contact region 16 at the −Y axis direction side.

A distance Ld indicates a difference between a depth of a lower end of the first contact region 15 and a depth of a lower end of the emitter region 12. That is, the distance Ld indicates a difference in depth between an end portion of the emitter region 12 at the −Z axis direction side and an end portion of the first contact region 15 at the −Z axis direction side.

Here, preferably, the distance Lc is larger than the distance Ld. This allows the second contact region 16 and the emitter region 12 to be apart from each other even if the position of the second contact region 16 is misaligned to some extent. Also, this can inhibit an increase in the peak concentration of the base region 14 which determines the gate threshold voltage Vth.

Also, preferably, the distance Lc is larger than a depth Le of a lower end of the second contact region 16. Providing the distance Lc to be larger than the distance Le allows the second contact region 16 and the emitter region 12 to be apart from each other even if the position of the second contact region 16 is misaligned to some extent. This can inhibit a decrease in the net doping concentration of the emitter region 12 due to the second contact region 16 and the emitter region 12 overlapping each other.

Also, the distance Lc may also be smaller than a depth Lf of the lower end of the emitter region 12. If the second contact region 16 has a depth smaller than the emitter region 12, a decrease in the net doping concentration of the emitter region 12 is less affected.

Also, preferably, the distance La is larger than the distance Ld. This allows the second contact region 16 and the emitter region 12 to be apart from each other even if the position of the second contact region 16 is misaligned to some extent. Also, an increase in the peak concentration of the base region 14 in the Vth determination region 65 can be inhibited.

In addition, preferably, the distance La is larger than the depth Lf of the lower end of the emitter region 12. Further, the distance La may be larger than a difference (Lf−Le) between the depth Lf of the lower end of the emitter region 12 and the depth Le of the lower end of the second contact region 16. This can ensure a distance between the Vth determination region 65 and the second contact region 16 and reduce an influence of the dopants of the second contact region 16 on the Vth determination region 65.

Note that the second contact region 16 and the gate trench portion 40 contact each other in Example 2. Therefore, the distance La in Example 2 may be a distance from a contact point of the second contact region 16 and the gate trench portion 40 to the emitter region 12. In Example 2, the distance La may be the same as the distance Lc.

Example 3

Figure 10:
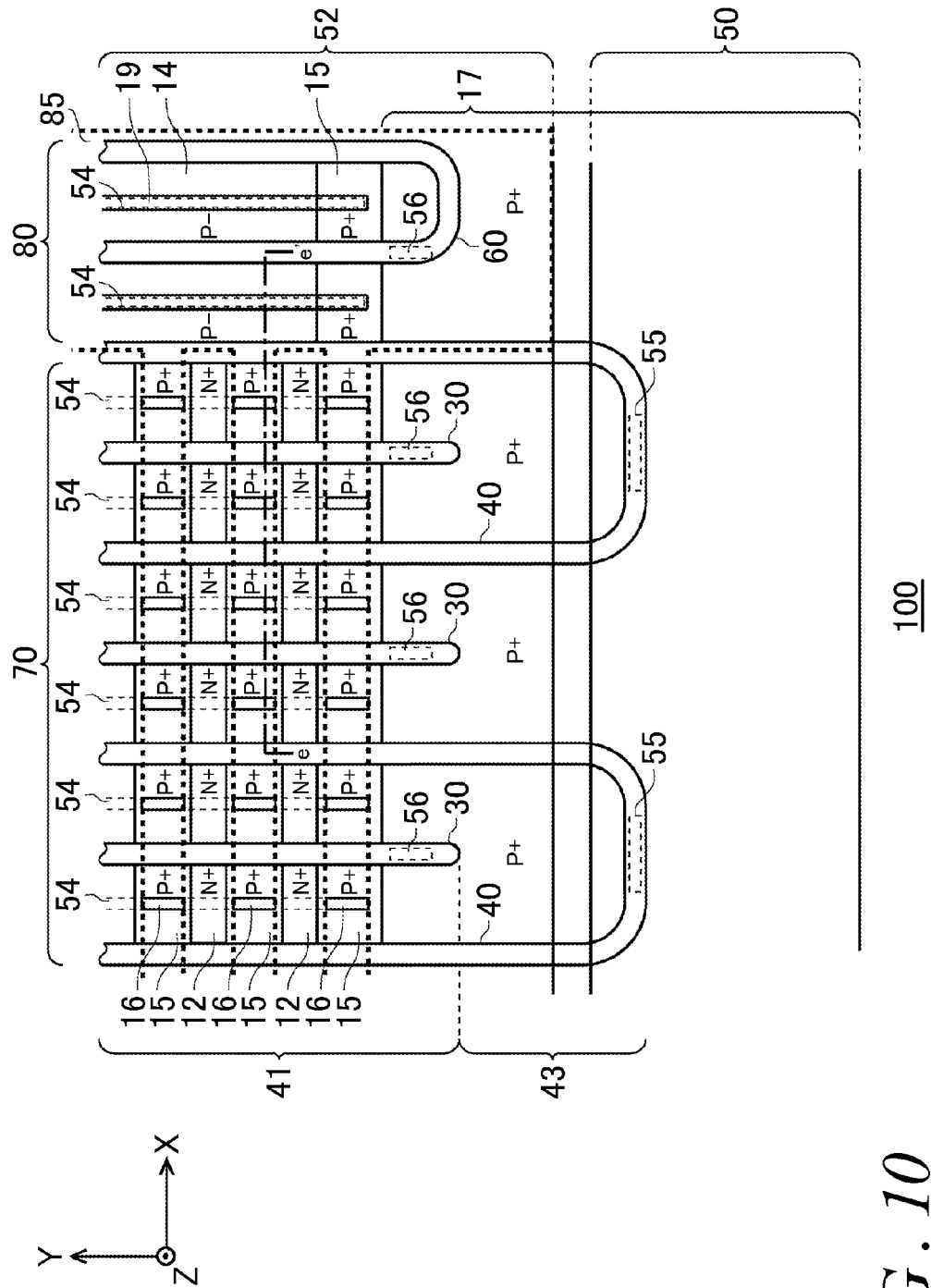
FIG. 10 is a plan view illustrating one example of a semiconductor device 100 according to Example 3.

FIG. 10 is a plan view illustrating one example of a semiconductor device 100 according to Example 3. The semiconductor device 100 of the present example is different from the semiconductor device 100 according to Example 1 in further comprising a third contact region 19. In the present example, the difference from the semiconductor device 100 according to Example 1 is particularly described.

The third contact region 19 is formed in the diode portion 80. The third contact region 19 is a region of the second conductivity type and having a higher doping concentration than the first contact region 15. The third contact region 19 of the present example is of P++ type. The third contact region 19 is formed at the front surface side of the semiconductor substrate 10. The third contact region 19 of the present example has a rectangular shape. However, the third contact region 19 may also have a shape with rounded corners. The third contact region 19 is formed in the vicinity of an interface of the semiconductor substrate 10 and the emitter electrode 52, thereby reducing a contact resistance between the emitter electrode 52 and the semiconductor substrate 10. Particularly, it is advantageous if titanium compound which contacts the semiconductor substrate 10 and a tungsten plug which contacts the titanium compound and aluminum or aluminum alloy of the emitter electrode 52 are formed between the emitter electrode 52 and the semiconductor substrate 10.

A mask opening region 85 is a region surrounded by dot lines in FIG. 10 and indicates a region to which dopants are implanted to form the third contact region 19. The mask opening region 85 may be an opening portion of a mask such as a resist mask in ion implantation. The mask opening region 85 of the present example is the entire surface of the diode portion 80. Dopants are blocked to regions other than the mask opening region 85 by a mask and the like. Therefore, dopants are not implanted to the semiconductor device 100. In the third contact region 19 of the present example, after the contact hole 54 is formed, the dopants of the third contact region 19 are implanted only to the mask opening region 85 of the diode portion 80 by using a mask. This allows the third contact region 19 to be formed only in the mask opening region 85, an opening portion of the mask, and further in an exposed surface of the semiconductor substrate 10 in a region in which the contact hole 54, an opening portion of the interlayer insulating film, is formed.

The third contact region 19 may be formed by using the same dopant implantation step as the one for the second contact region 16. In this case, as illustrated in FIG. 10, the mask opening region 85 may extend to a region in which the second contact region 16 is formed in the transistor portion 70.

The transistor portion 70 includes, between the trenches, the emitter region 12, the base region 14, the first contact region 15 and the second contact region 16. In the present example, in the transistor portion 70, the second contact region 16 is formed to be apart from the emitter region 12. That is, the mask opening region 85 may be positioned inside the first contact region 15, with respect to a position of the first contact region 15 on the front surface of the semiconductor substrate 10 along the extending direction in a finished state.

The diode portion 80 includes, between the trenches, the base region 14, the first contact region 15 and the third contact region 19. Here, in the transistor portion 70, the second contact region 16 is surrounded by the first contact region 15 in a planar view.

On the other hand, in the diode portion 80, the first contact region 15 is formed to surround only an end portion of the contact hole 54 in the trench extending direction. That is, the diode portion 80 includes, in a planar view, the first contact region 15 formed at one of the end portions of the contact hole 54 in the trench extending direction in a mesa region positioned between the trenches, the base region 14 exposed to the front surface to contact the first contact region 15 formed at one of the end portions of the contact hole 54 in the trench extending direction, and the first contact region 15 formed at the other end portion of the contact hole 54 in the trench extending direction while contacting the base region 14. In other words, in a planar view, the third contact region 19 is not surrounded by the first contact region 15, except for both ends in the extending direction of the trench portion.

The first contact region 15 may be formed to have a length in the trench extending direction smaller than 50%, smaller than 30%, smaller than 20%, or smaller than 10% of a length of the contact hole 54 in the trench extending direction. Also, the position of the first contact region 15 of the diode portion 80 may be the same as a position to which the outermost first contact region 15 of the transistor portion 70 is extended in the trench arrangement direction. Here, the outermost first contact region 15 of the transistor portion 70 refers to the first contact region 15 formed at one of the end portions of the contact hole 54 in the trench extending direction. This can reduce an area ratio of the first contact region 15 in the diode portion 80 by the ratio described above, with respect to an exposed area of the base region 14.

In one example, the concentration of the third contact region 19 is the same the concentration of the second contact region 16. However, the concentration of the third contact region 19 may be lower than the concentration of the second contact region 16. For example, the second contact region 16 is formed in the first contact region 15 of P+ type and the third contact region 19 is formed in the base region 14 of P− type. That is, if the second contact region 16 and the third contact region 19 are formed in the same process, the doping concentration of the third contact region 19 is lower than the doping concentration of the second contact region 16.

Figure 11:
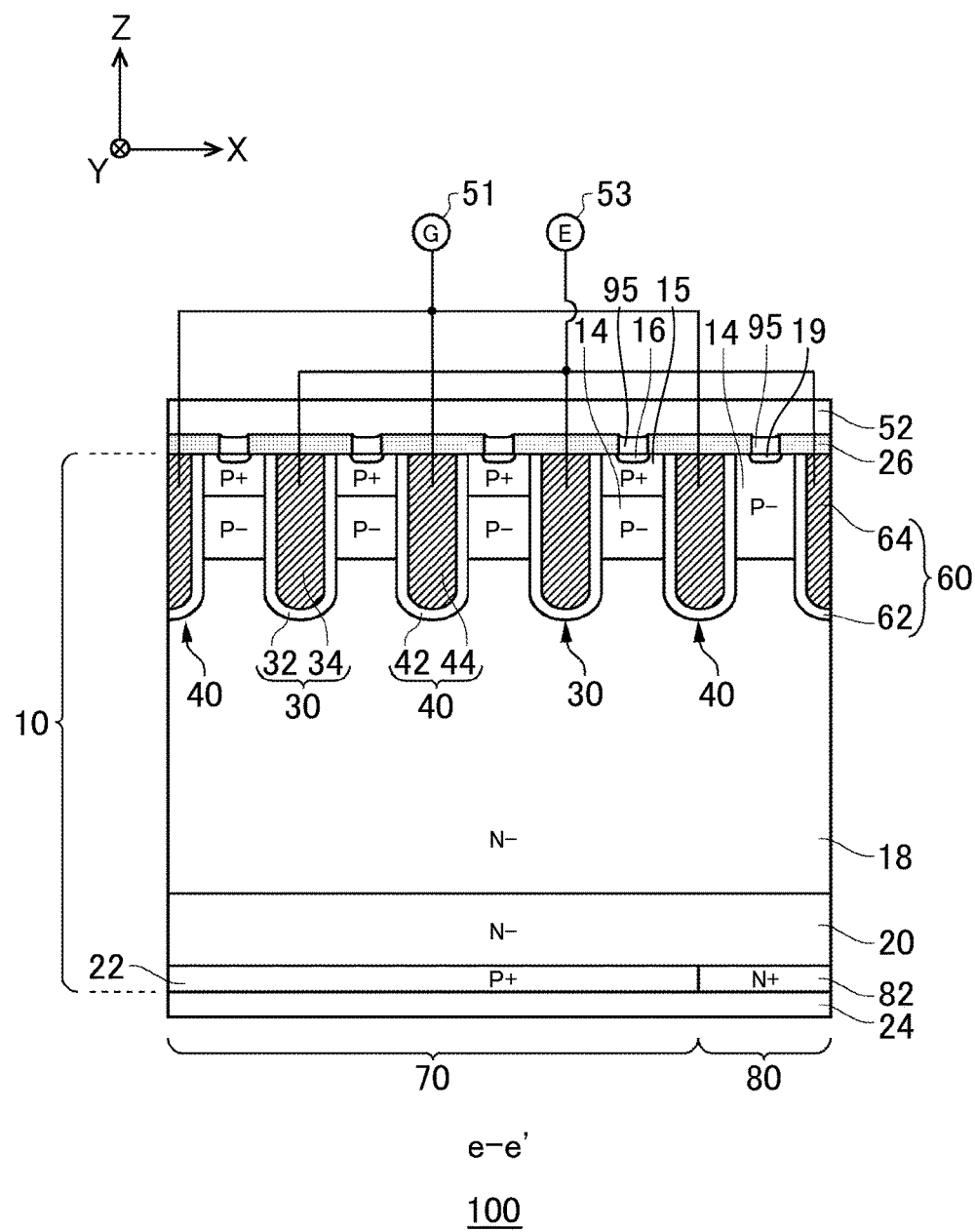
FIG. 11 is a diagram illustrating one example of an e-e' cross section of the semiconductor device 100 according to Example 3.

FIG. 11 is a diagram illustrating one example of an e-e' cross section of the semiconductor device 100 according to Example 3. The semiconductor device 100 of the present example comprises a tungsten plug 95. The tungsten plug 95 of the present example is provided in both of the transistor portion 70 and the diode portion 80. However, the tungsten plug 95 may be provided in either the transistor portion 70 or the diode portion 80.

Also, the third contact region 19 may have the same depth as a depth of the second contact region 16. However, the third contact region 19 may have the depth larger than the depth of the second contact region 16. For example, the second contact region 16 is formed in the first contact region 15 of P+ type and the first contact region 15 is formed in the base region 14 of P− type. On the other hand, the third contact region 19 is formed on the base region 14 of P− type without the first contact region 15. Therefore, if the second contact region 16 and the third contact region 19 are formed in the same process, the third contact region 19 may have a depth a bit larger than the depth of the second contact region 16.

The second contact region 16 may have a larger width in the trench arrangement direction than the width of the contact hole 54 in the trench arrangement direction. Also, the third contact region 19 may have a larger width in the trench arrangement direction than the width of the contact hole 54 in the trench arrangement direction. This can reduce a contact resistance between the emitter electrode 52 and the semiconductor substrate 10, compared to the case in which the second contact region 16 or the third contact region 19 has a smaller width than the contact hole 54 in the trench arrangement direction.

The semiconductor device 100 of the present example can reduce the contact resistance between the emitter electrode 52 and the semiconductor substrate 10 by forming the third contact region 19 in the diode portion 80. Also, the semiconductor device 100 of the present example comprises the third contact region 19 formed on the entire surface of the contact hole 54 in the diode portion 80, thereby resulting in a stable contact between the emitter electrode 52 and the semiconductor substrate 10. The first contact region 15 is formed only at the end of the diode portion 80 in the trench extending direction, thereby minimizing an area ratio of the first contact region 15. This can minimize an influence on implantation of holes in the first contact region 15. That is, an implantation efficiency of minority carriers in the diode portion 80 can be set almost exclusively based on the concentration of the base region 14 of P type. Therefore, a reverse recovery characteristic of a diode operation can be a soft recovery.

Example 4

Figure 12:
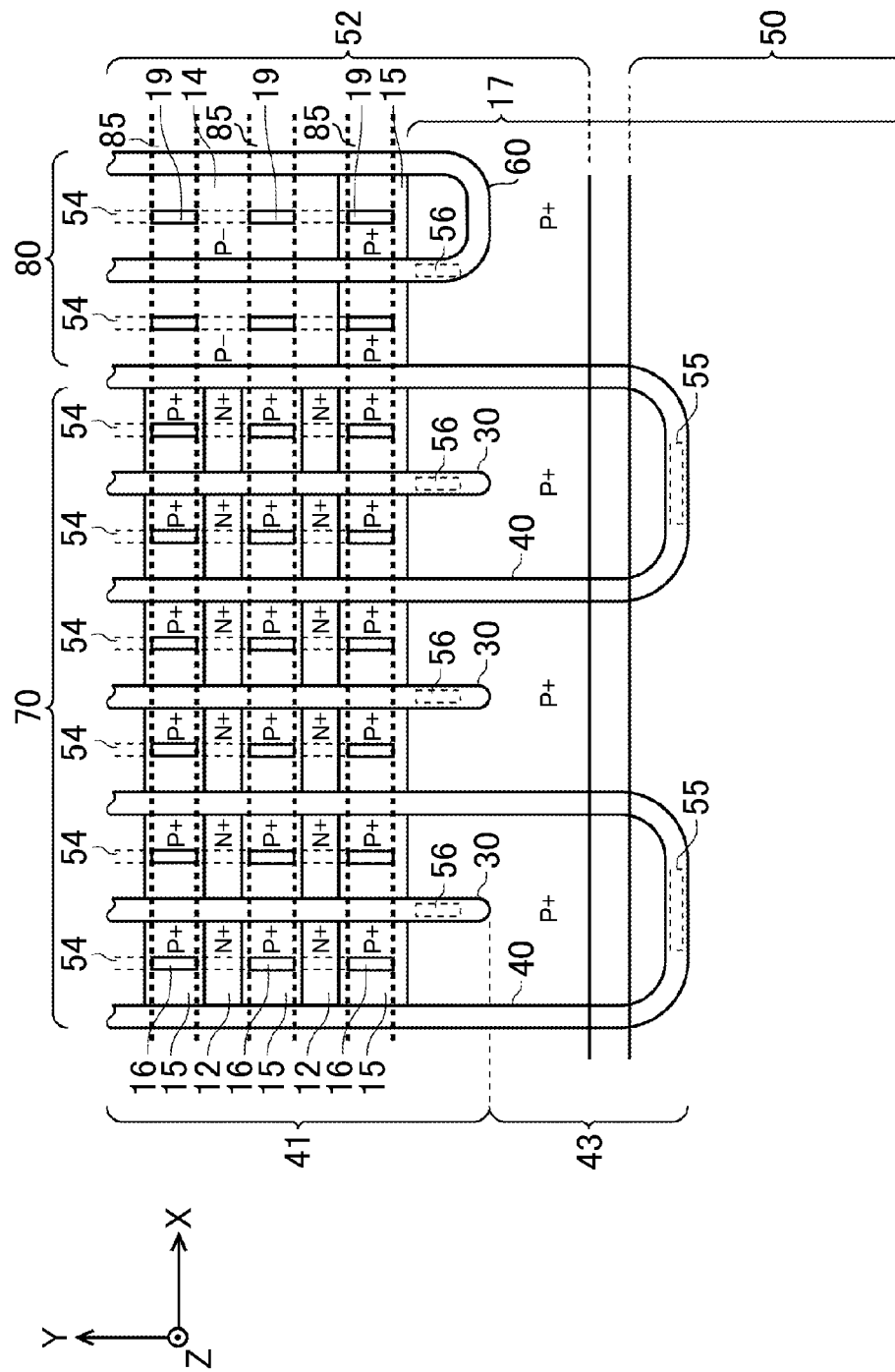
FIG. 12 is a plan view illustrating one example of a semiconductor device 100 according to Example 4.

FIG. 12 is a plan view illustrating one example of a semiconductor device 100 according to Example 4. The semiconductor device 100 of the present example is different from the semiconductor device 100 according to Example 3 in a pattern of the third contact region 19. In the present example, the difference from the semiconductor device 100 according to Example 3 is particularly described.

The third contact region 19 is provided in the extending direction in a discrete manner. In one example, the third contact region 19 is provided evenly in the extending direction to have a predetermined interval. For example, the third contact region 19 is arranged to have an interval in the extending direction equal to or smaller than 10 μm, or equal to or smaller than 5 μm. This allow an area of a region in which the third contact region 19 is provided to be smaller than a contact area of the emitter electrode 52 in the diode portion 80 and the semiconductor substrate 10.

Here, if the third contact region 19 is formed, a dose amount of the front surface side of the semiconductor substrate 10 is increased, which may increases a reverse recovery current during an FWD operation and increase a loss. However, the third contact region 19 of the present example is provided in a portion of the contact area between the emitter electrode 52 in the diode portion 80 and the semiconductor substrate 10, thereby inhibiting the reverse recovery current and the loss. That is, the pattern of the third contact region 19 may be designed as appropriate depending on the contact resistance between the emitter electrode 52 and the semiconductor substrate 10 and the reverse recovery characteristic of the semiconductor device 100. This can further inhibit implantation of holes and particularly reduce the reverse recovery current among the soft recovery characteristics, compared to Example 3.

In one example, the third contact region 19 may have an area, in a planar view, which is equal to or less than 50%, or equal to or less than 20% of the contact area between the emitter electrode 52 in the diode portion 80 and the semiconductor substrate 10, or an area which is equal to or less than 10%. Note that the third contact region 19 of the present example is provided in the extending direction in a discrete manner, but may also be provided in the arrangement direction in a discrete manner. In this case, the third contact region 19 is formed in one of the adjacent contact holes 54 while the third contact region 19 is not formed in the other. This allows the third contact regions 19 to be provided intermittently in the arrangement direction.

The mask opening region 85 of the diode portion 80 may be shorter in the trench extending direction than the mask opening region 85 of the transistor portion 70. This can inhibit implantation of holes more while keeping on reducing the contact resistance in the diode portion 80.

The semiconductor device 100 of the present example can reduce the contact resistance between the emitter electrode 52 and the semiconductor substrate 10 by forming the third contact region 19 in the diode portion 80. In the semiconductor device 100 of the present example, the third contact regions 19 are formed intermittently in the diode portion 80, which can achieve a stable contact between the emitter electrode 52 and the semiconductor substrate 10 and inhibit the reverse recovery current and the loss, concurrently.

Example 5

Figure 13:
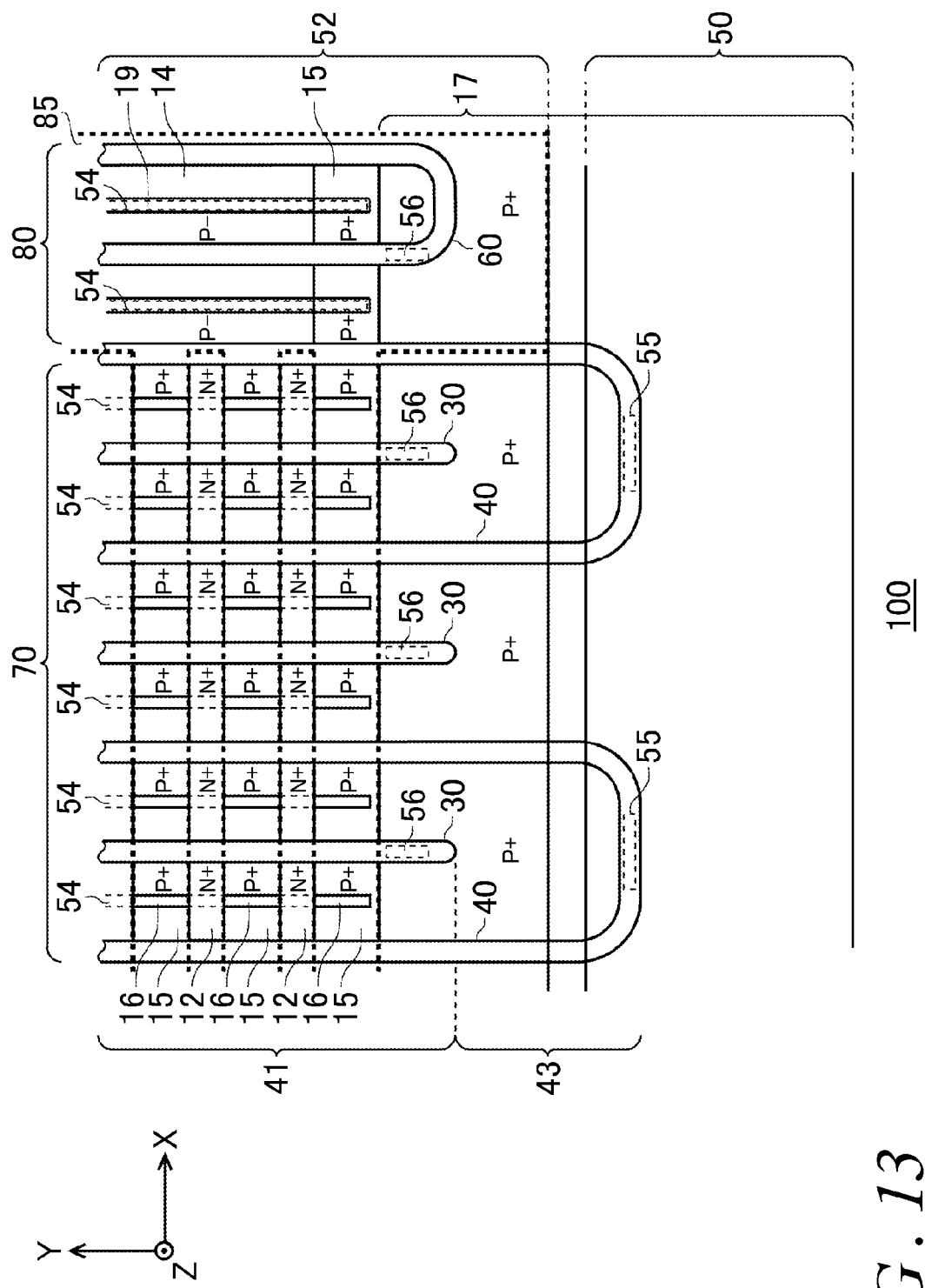
FIG. 13 is a plan view illustrating one example of a semiconductor device 100 according to Example 5.

FIG. 13 is a plan view illustrating one example of a semiconductor device 100 according to Example 5. The semiconductor device 100 of the present example is different from the semiconductor device 100 according to Example 3 in a pattern of the second contact region 16. In the present example, the difference from the semiconductor device 100 according to Example 3 is particularly described.

The position of the mask opening region 85 for forming the second contact region 16 of the transistor portion 70 may be the same as a position of an end of the first contact region 15 in a finished state. If the second contact region 16 and the first contact region 15 exist in a region of the emitter region 12 in which the concentration in the trench extending direction is decreased due to diffusion in the lateral direction, the gate threshold can be less affected by the second contact region 16. This can further reduce the contact resistance between the plug and the second contact region 16 and obtain the same effect as in Example 3 and Example 4.

Example 6

Figure 14:
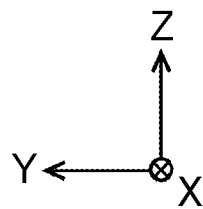
FIG. 14 is a cross sectional view illustrating one example of a semiconductor device 100 according to Example 6.
Figure 14:
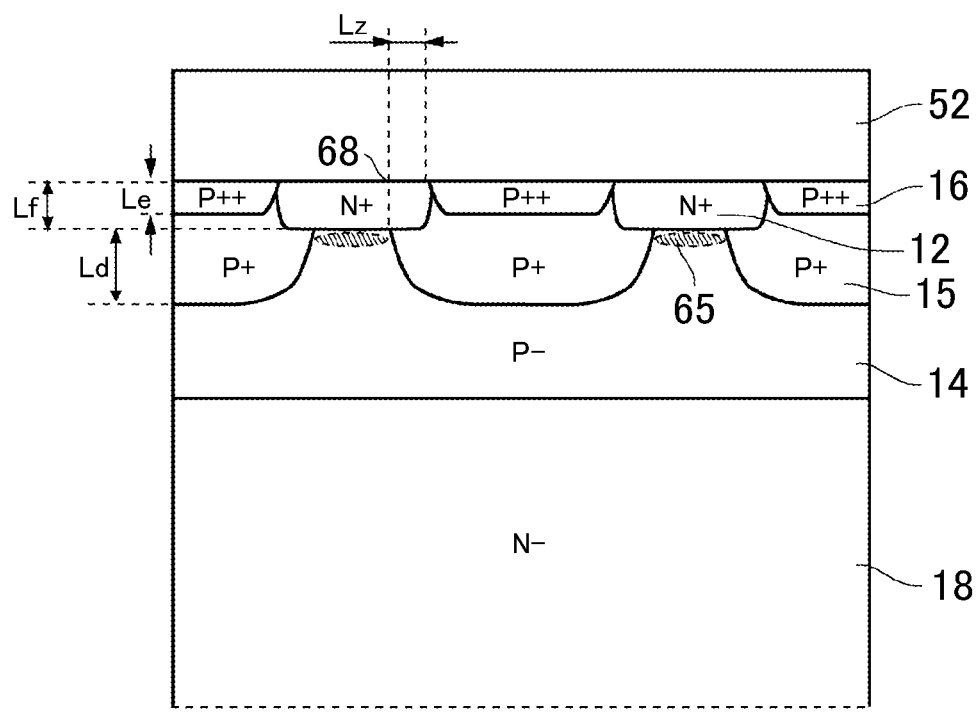

FIG. 14 is a cross sectional view illustrating one example of the semiconductor device 100 according to Example 6 which is a modification example of the b-b' cross section in FIG. 1. The semiconductor device 100 of the present example is different from the semiconductor device 100 according to Example 1 in a pattern of the second contact region 16. In the present example, the difference from the semiconductor device 100 according to Example 1 is particularly described.

The second contact region 16 may contact the emitter region 12 in the extending direction in a finished state. Alternatively, the second contact region 16 may overlap with the emitter region 12 in the extending direction in a finished state. In the example of FIG. 14, the second contact region 16 overlaps with a position above the end of the emitter region 12 in the extending direction in a finished state. In a planar view, the position of the end of the second contact region 16 in the trench extending direction is the same as the position of the end of the first contact region 15, if the second contact region 16 contacts the emitter region 12.

Note that the Vth determination region 65 illustrated in FIG. 14 is a region which schematically illustrates the determination region 65 on a side wall of the gate trench portion 40 when a cross section along the extending direction is projected on the side wall of the trench. In practice, the shape and position of the Vth determination region 65 are not limited to those illustrated in FIG. 14. Also, given that a position at which the end of the first contact region 15 in the extending direction contacts the bottom surface of the emitter region 12 is projected on the front surface of the semiconductor substrate 10, the projected position is defined as a junction position 68. The junction position 68 is positioned inside the emitter region 12 in a planar view.

A distance along the extending direction from the junction position 68 to a position at which the second contact region 16 and the emitter region 12 contact the front surface of the semiconductor substrate 10 is defined as a distance Lz. As a result, the second contact region 16 is apart from the Vth determination region 65 along the extending direction by at least the distance Lz. This can reduce an influence of the dopants of the second contact region 16 on the Vth determination region 65.

The distance Lz may be, for example, smaller than La. This can reduce an influence of the dopants of the second contact region 16 on the Vth determination region 65.

Also, the distance Lz may be larger than the junction depth Lf of the emitter region 12. Further, the distance Lz may be larger than a difference (Lf−Le) between the depth Lf of the lower end of the emitter region 12 and the depth Le of the lower end of the second contact region 16. This can ensure a distance between the Vth determination region 65 and the second contact region 16 and reduce an influence of the dopants of the second contact region 16 on the Vth determination region 65.

Figure 15:
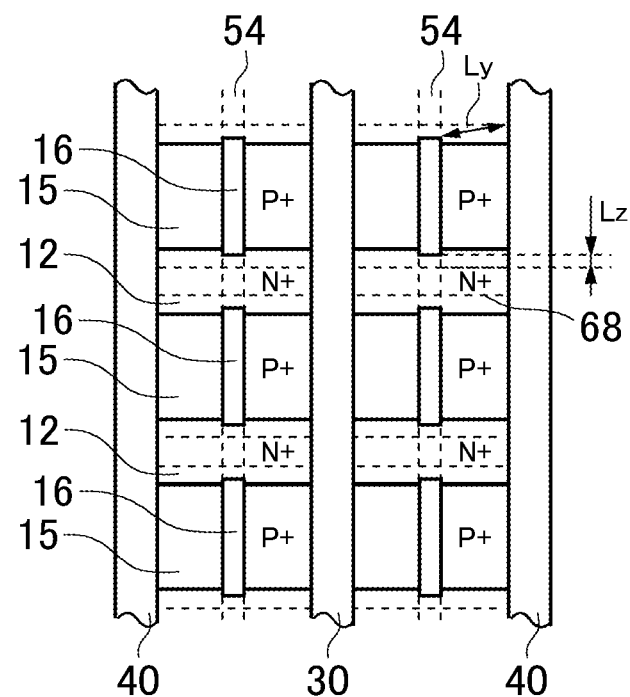
FIG. 15 illustrates one example of a plan view of the semiconductor device 100 according to Example 6.

FIG. 15 illustrates one example of a plan view of the semiconductor device 100 according to Example 6. FIG. 15 is a plan view when FIG. 14 is seen in a planar view in the Z axis direction, and illustrates a region between the gate trench portion 40 and the dummy trench portion 30. In the present example, one example of a positional relationship between the second contact region 16 and the other regions is illustrated. In FIG. 15, the second contact region 16 overlaps with the emitter region 12 in the extending direction in a finished state. That is, the difference between FIG. 15 and FIG. 8 lies in that the second contact region 16 covers a point above the end of the emitter region 12 in the extending direction in a finished state.

A distance Ly indicates the shortest distance between the second contact region 16 and a contact point of the gate trench portion 40 and the junction position 68. In the present example, although the end of the second contact region 16 in the trench extending direction covers the emitter region 12, it is positioned closer to the first contact region 15 side than the junction position 68. That is, the position of the end of the second contact region 16 in the trench extending direction is positioned inside the emitter region 12 and apart from the junction position 68 in a planar view. The distance Ly may be larger than the distance Lz. Also, the distance Ly may be longer than the length of the first contact region 15 in the trench extending direction. This can reduce an influence of the dopants of the second contact region 16 on the Vth determination region 65.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate, 12: emitter region, 14: base region, 15: first contact region, 16: second contact region, 17: well region, 18: drift region, 19: third contact region, 20: buffer region, 22: collector region, 24: collector electrode, 26: interlayer insulating film, 30: dummy trench portion, 32: insulating film, 34: dummy conductive portion, 40: gate trench portion, 41: opposing portion, 42: insulating film, 43: protruding portion, 44: gate conductive portion, 50: gate electrode, 51: gate terminal, 52: emitter electrode, 53: emitter terminal, 54: contact hole, 55: contact hole, 56: contact hole, 60: emitter trench portion, 62: insulating film, 64: emitter conductive portion, 65: Vth determination region, 68: junction position, 70: transistor portion, 80: diode portion, 82: cathode region, 85: mask opening region, 95: tungsten plug, 100: semiconductor device, 500: semiconductor device, 510: semiconductor substrate, 512: emitter region, 514: base region, 515: contact region, 517: well region, 518: drift region, 520: buffer region, 522: collector region, 524: collector electrode, 526: interlayer insulating film, 530: dummy trench portion, 532: insulating film, 534: dummy conductive portion, 540: gate trench portion, 541: opposing portion, 542: insulating film, 543: protruding portion, 544: gate conductive portion, 550: gate electrode, 551: gate terminal, 552: emitter electrode, 553: emitter terminal, 554: contact hole, 555: contact hole, 556: contact hole, 560: emitter trench portion, 562: insulating film, 564: emitter conductive portion, 570: transistor portion, 580: diode portion, 582: cathode region

What is claimed is:

1. A semiconductor device comprising:
   a semiconductor substrate;
   a plurality of first trench portions formed at a front surface side of the semiconductor substrate and extending in a predetermined extending direction in a planar view;
   an emitter region of a first conductivity type formed between adjacent trenches of the plurality of first trench portions at the front surface side of the semiconductor substrate;
   a first contact region of a second conductivity type formed between the adjacent trenches of the plurality of first trench portions, the first contact region and the emitter region being arranged alternately in the extending direction; and
   a second contact region of a second conductivity type formed above the first contact region to be apart from the emitter region and having a higher doping concentration than the first contact region.

2. The semiconductor device according to claim 1, wherein an interval in a planar view between the second contact region and the emitter region formed to be apart from each other is larger than a difference between a depth of a lower end of the first contact region and a depth of a lower end of the emitter region.

3. The semiconductor device according to claim 1, wherein the first contact region is formed in at least some regions below the emitter region.

4. The semiconductor device according to claim 1, wherein the second contact region is formed at a depth smaller than the emitter region.

5. The semiconductor device according to claim 1, wherein the second contact region contacts the plurality of first trench portions formed at both ends of the second contact region.

6. The semiconductor device according to claim 1, wherein each of the first trench portions includes one of a gate trench and a dummy trench.

7. The semiconductor device according to claim 1, further comprising
a base region of a second conductivity type, which is provided below the emitter region and the first contact region and having a lower doping concentration than the first contact region, and
a drift region of a first conductivity type, which is provided below the base region and having a lower doping concentration than the base region,
wherein the plurality of first trench portions penetrate the base region to be in direct contact with the drift region.

8. The semiconductor device according to claim 1, wherein the second contact region is formed between the adjacent trenches of the plurality of first trench portions.

9. The semiconductor device according to claim 1, wherein the emitter region and the first contact region contact the plurality of first trench portions formed at both ends of the emitter region and the first contact region.

10. The semiconductor device according to claim 9, wherein a shortest distance between the second contact region and a contact point of the plurality of first trench portions and the emitter region is larger than a distance for which the emitter region and the first contact region overlap in the extending direction in a planar view.

11. The semiconductor device according to claim 9, wherein a shortest distance between the second contact region and a contact point of the plurality of first trench portions and the emitter region is larger than a difference between a depth of a lower end of the first contact region and a depth of a lower end of the emitter region.

12. The semiconductor device according to claim 1, further comprising:
an interlayer insulating film formed on the front surface of the semiconductor substrate; and
an emitter electrode formed above the interlayer insulating film, wherein
the plurality of first trench portions are arranged in a predetermined arrangement direction in a planar view, and
a contact hole is formed in the interlayer insulating film to connect the emitter electrode and the second contact region, the second contact region having a width in the arrangement direction larger than a width of the contact hole in the arrangement direction.

13. The semiconductor device according to claim 12, wherein the emitter electrode and the second contact region are electrically connected via a tungsten plug.

14. The semiconductor device according to claim 1, comprising:
a transistor portion including the plurality of first trench portions, the emitter region, the first contact region and the second contact region; and
a diode portion including a plurality of second trench portions which are formed at the front surface side of the semiconductor substrate and extend in a predetermined extending direction in a planar view, and a third contact region of a second conductivity type which is formed at the front surface side of the semiconductor substrate and has a higher doping concentration than the first contact region.

15. The semiconductor device according to claim 14, wherein the third contact region is provided in the extending direction in a discrete manner.

16. The semiconductor device according to claim 14, wherein the third contact region has an area, in a planar view, which is equal to or less than 50% of a contact area of an emitter electrode in the diode portion and the semiconductor substrate.

17. A semiconductor device comprising a semiconductor substrate and a transistor portion and a diode portion formed in the semiconductor substrate, wherein the transistor portion includes:
a plurality of first trench portions formed at a front surface side of the semiconductor substrate and extending in a predetermined extending direction in a planar view;
an emitter region of a first conductivity type formed between adjacent trenches of the plurality of first trench portions at the front surface side of the semiconductor substrate;
a first contact region of a second conductivity type formed between the adjacent trenches of the plurality of first trench portions, the first contact region and the emitter region being arranged alternately in the extending direction; and
a second contact region of a second conductivity type formed above the first contact region and having a higher doping concentration than the first contact region, and wherein the diode portion includes:
a plurality of second trench portions formed at the front surface side of the semiconductor substrate and extending in a predetermined extending direction in a planar view; and
a third contact region of a second conductivity type formed at the front surface side of the semiconductor substrate and having a higher doping concentration than the first contact region.

18. The semiconductor device according to claim 17, wherein the third contact region provided in the diode portion is provided in the extending direction in a discrete manner.

19. The semiconductor device according to claim 17, wherein the third contact region has an area, in a planar view, which is equal to or less than 50% of a contact area of an emitter electrode in the diode portion and the semiconductor substrate.

20. A semiconductor device comprising:
a semiconductor substrate;
a plurality of first trench portions formed at a front surface side of the semiconductor substrate and extending in a predetermined extending direction in a planar view;
an emitter region of a first conductivity type formed between adjacent trenches of the plurality of first trench portions at the front surface side of the semiconductor substrate;
a first contact region of a second conductivity type formed between the adjacent trenches of the plurality of first trench portions, the first contact region and the emitter region being arranged alternately in the extending direction; and
a second contact region of a second conductivity type formed above the first contact region to contact the emitter region and having a higher doping concentration than the first contact region, wherein the first contact region has a depth in a direction from the front surface side to a back surface side of semiconductor substrate larger than the emitter region, an end of the first contact region along the extending direction of the plurality of first trench portions reaches a bottom surface of the emitter region, a position at which the end of the first contact region in the extending direction contacts the bottom surface of the emitter region is projected on the front surface of the semiconductor substrate at a junction position, the junction position being apart from a position of an end of the second contact region in the extending direction, and the junction position is inside the emitter region.

21. The semiconductor device according to claim 20, wherein the second contact region covers a position above an end of the emitter region in the extending direction of the trench portion.

22. The semiconductor device according to claim 20, wherein a distance between the second contact region and the junction position is larger than a junction depth of the emitter region.

* * * * *